US008166985B2

(12) United States Patent
Nishiyama et al.

(10) Patent No.: US 8,166,985 B2
(45) Date of Patent: May 1, 2012

(54) SUBSTRATE CLEANING AND PROCESSING APPARATUS WITH MAGNETICALLY CONTROLLED SPIN CHUCK HOLDING PINS

(75) Inventors: Koji Nishiyama, Kyoto (JP); Hiroshi Yoshii, Kyoto (JP)

(73) Assignee: Sokudo Co., Ltd., Kyoto (JP)

( * ) Notice: Subject to any disclaimer, the term of this patent is extended or adjusted under 35 U.S.C. 154(b) by 707 days.

(21) Appl. No.: 12/267,535

(22) Filed: Nov. 7, 2008

(65) Prior Publication Data

US 2009/0120472 A1 May 14, 2009

(30) Foreign Application Priority Data

Nov. 13, 2007 (JP) ................................. 2007-294072

(51) Int. Cl.
*B08B 3/00* (2006.01)
(52) U.S. Cl. ........ 134/137; 134/149; 134/153; 134/157; 134/902
(58) Field of Classification Search ............... 134/76, 134/137, 149, 153, 157, 902; 15/77, 88.2, 15/88.3, 302
See application file for complete search history.

(56) References Cited

U.S. PATENT DOCUMENTS

| 6,276,378 | B1 | 8/2001 | Taniyama et al. | |
| 2002/0157692 | A1 | 10/2002 | Ishihara et al. | |
| 2002/0195128 | A1 | 12/2002 | Shibagaki | |
| 2003/0205253 | A1 | 11/2003 | Shibagaki | |
| 2007/0089767 | A1* | 4/2007 | Yamamoto | 134/149 |
| 2007/0226926 | A1* | 10/2007 | Hiraoka et al. | 15/102 |

FOREIGN PATENT DOCUMENTS

| CN | 1393911 A | | 1/2003 |
| CN | 101436564 B | | 10/2011 |
| JP | 10-083948 A | | 3/1998 |
| JP | 10-092912 | | 4/1998 |
| JP | 2000-223460 | | 8/2000 |
| JP | 2002-324828 | | 11/2002 |
| JP | 2002-368066 A | | 12/2002 |
| JP | 2005-142585 A | | 6/2005 |
| JP | 2007-150262 A | | 6/2007 |
| JP | 2007-273610 | | 10/2007 |
| KR | 1020070115508 | * | 6/2007 |
| KR | 10-0746576 B1 | | 7/2007 |
| KR | 10-2007-0115508 A | | 12/2007 |

* cited by examiner

*Primary Examiner* — Michael Barr
*Assistant Examiner* — Saeed T Chaudhry
(74) *Attorney, Agent, or Firm* — Kilpatrick Townsend & Stockton LLP

(57) ABSTRACT

When a substrate is subjected to bevel cleaning processing, a first magnet plate is arranged at a lower position, and a second magnet plate is arranged at an upper position. In this case, each of chuck pins enters a closed state in a region outside the first magnet plate, while entering an opened state in a region outside the second magnet plate. That is, a holder in each of the chuck pins is maintained in contact with an outer edge of the substrate when it passes through the region outside the first magnet plate, while being spaced apart from the outer edge of the substrate when it passes through the region outside the second magnet plate.

6 Claims, 14 Drawing Sheets

FIG. 8
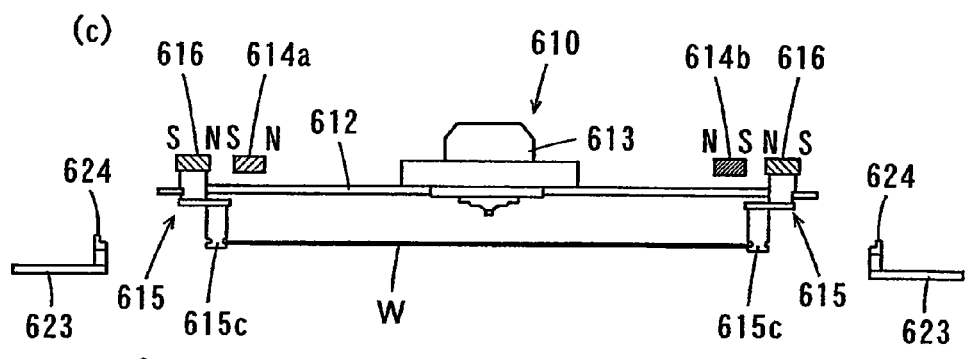
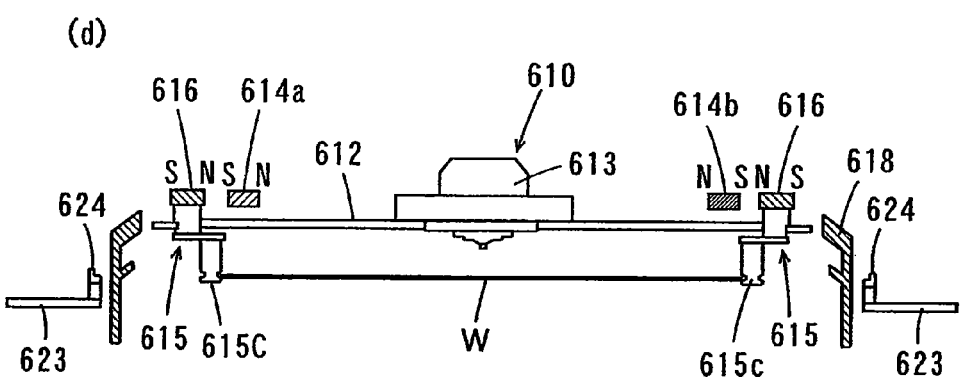

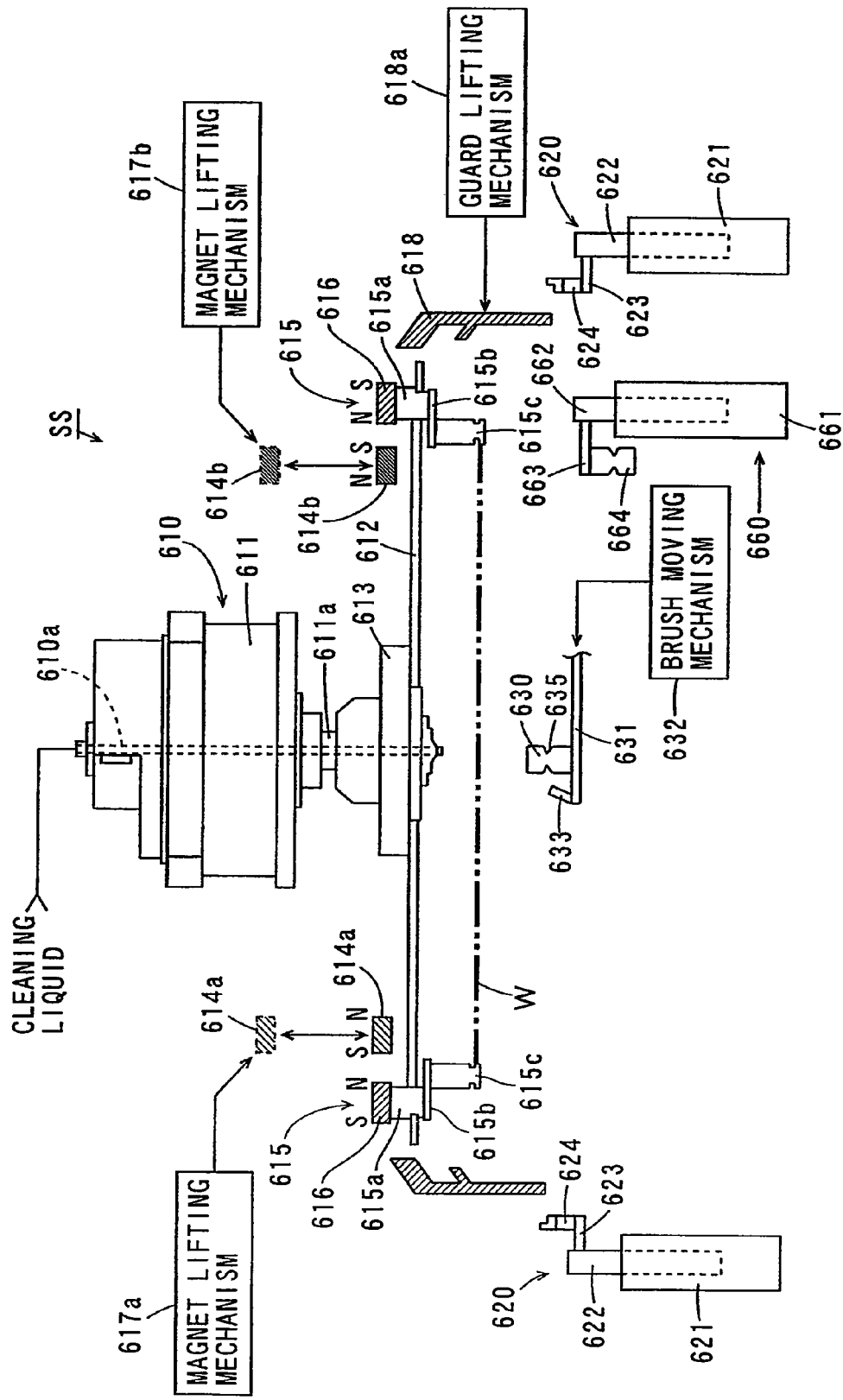

F I G. 1 3
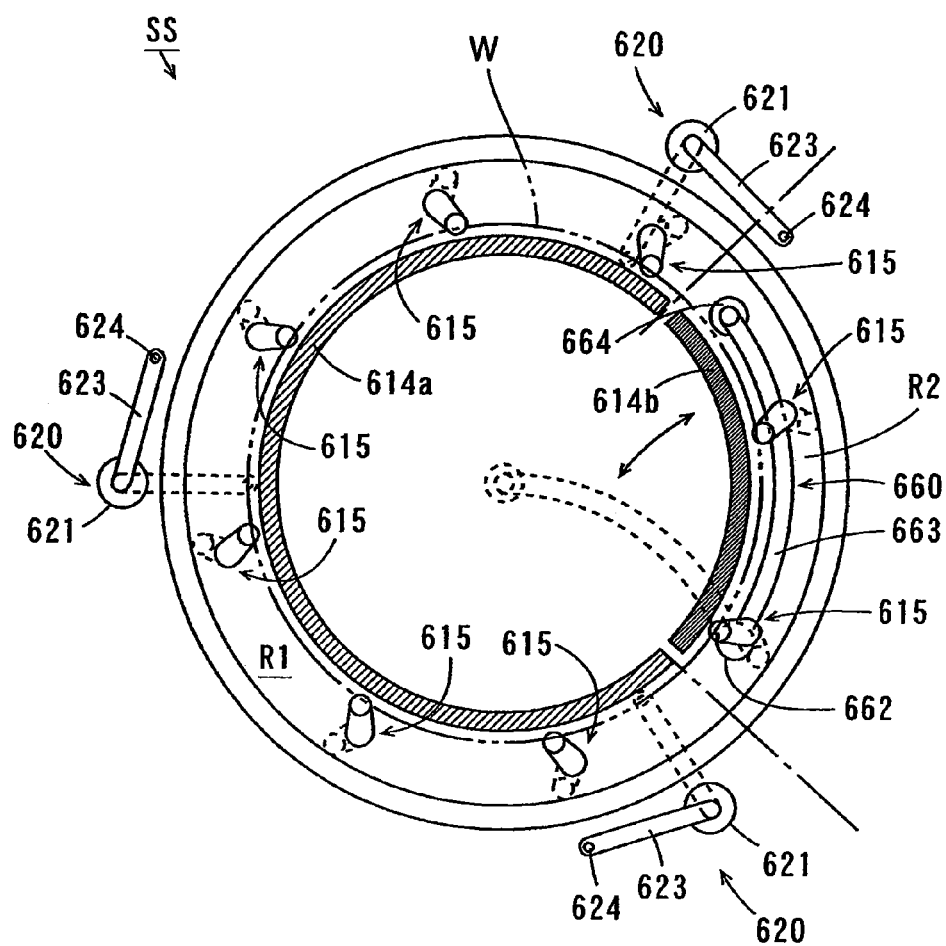

FIG. 14
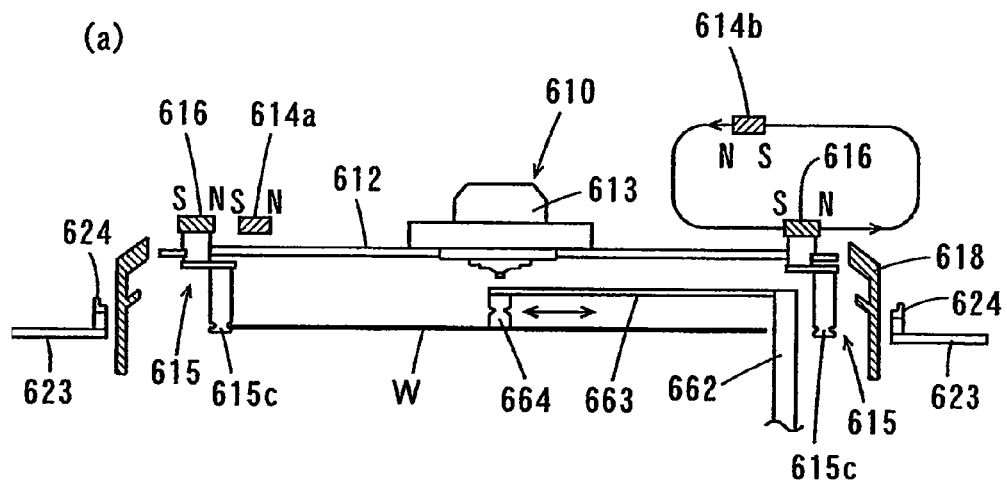
(a)
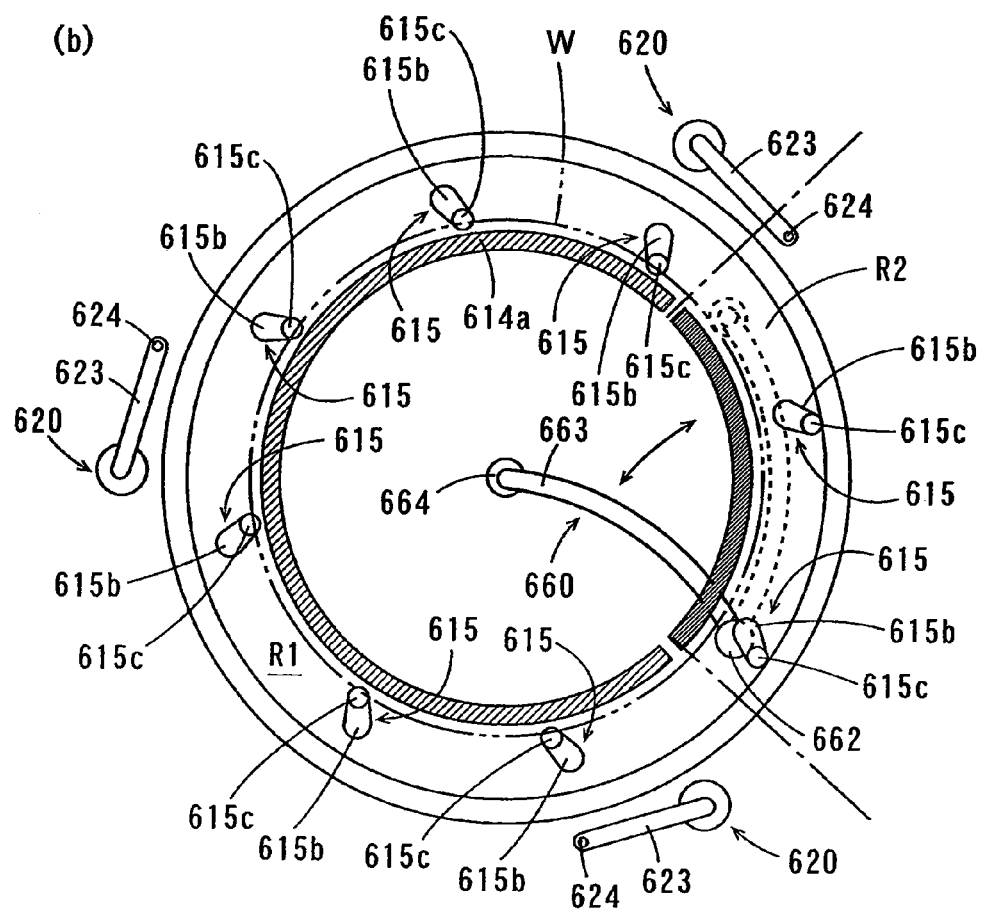
(b)

SUBSTRATE CLEANING AND PROCESSING APPARATUS WITH MAGNETICALLY CONTROLLED SPIN CHUCK HOLDING PINS

CROSS-REFERENCES TO RELATED APPLICATIONS

This application claims priority to Japanese Patent Application 2007-294072, filed Nov. 13, 2007. The disclosure of JP 2007-294072 is hereby incorporated by reference in its entirety for all purposes.

BACKGROUND OF THE INVENTION

The present invention relates to a substrate holding and rotating device that rotates a substrate while holding the substrate, and a substrate cleaning apparatus and a substrate processing apparatus including the same.

Substrate processing apparatuses have been conventionally used to subject substrates such as semiconductor wafers, and glass substrates for photomasks, liquid crystal displays, and optical disks to various types of processing.

In the substrate processing apparatuses, the substrates are subjected to cleaning processing with the substrates held by spin chucks. Examples of the spin chucks include end surface holding type spin chucks that hold outer edges of the substrates (see, for example, JP 10-92912 A). The end surface holding type spin chuck includes a motor, a spin base driven to rotate by the motor, and a plurality of holding pins provided on the spin base. The plurality of holding pins are abutted against the outer edge of the substrate so that the substrate is held on the spin base. The spin chuck rotates around a vertical axis so that the substrate rotates in a horizontal attitude. In this state, the top surface of the substrate is cleaned with a brush or the like.

However, not only the top surface of the substrate but also the outer edge of the substrate must, in some cases, be cleaned. In such a case, when the outer edge of the substrate is held by the plurality of holding pins, the whole of the outer edge of the substrate is difficult to uniformly clean.

SUMMARY OF THE INVENTION

An object of the present invention to provide a substrate holding and rotating device capable of cleaning the whole of an outer edge of a substrate, and a substrate cleaning apparatus and a substrate processing apparatus including the same.

According to an aspect of the present invention, a substrate holding and rotating device that rotates a substrate while holding the substrate includes a rotating member provided so as to be rotatable around a rotation axis, a rotation-driving mechanism that rotates the rotating member, a plurality of holding members provided on the rotating member so as to be switchable between a substrate held state where they are abutted against an outer edge of the substrate to hold the substrate and a substrate released state where they are spaced apart from the outer edge of the substrate, and a holding member switching mechanism that switches the plurality of holding members between the substrate held state and the substrate released state, in which each of the plurality of holding members rotates around the rotation axis through a first region and a second region along the outer edge of the substrate as the rotation-driving mechanism rotates the rotating member, and the holding member switching mechanism brings the holding members positioned in the first region out into the substrate held state while bringing the holding member positioned in the second region into the substrate released state during the rotation of the rotating member.

In the substrate holding and rotating device, the rotation-driving mechanism rotates the rotating member around the rotation axis. The plurality of holding members provided on the rotating member are switched by the holding member switching mechanism between the substrate held state where they are abutted against the outer edge of the substrate to hold the substrate and the substrate released state where they are spaced apart from the outer edge of the substrate.

During the rotation of the rotating member, the holding member switching mechanism brings the holding members positioned in the first region into the substrate held state, while bringing the holding member positioned in the second region into the substrate released state. In this case, the holding members positioned in the first region move with the substrate held therein, while the holding member positioned in the second region moves with the holding member spaced apart from the outer edge of the substrate. This causes a space to be formed between the outer edge of the substrate and the holding member that passes through the second region, allowing the whole outer edge of the substrate to be cleaned in the space. Therefore, it is possible to prevent processing defects from occurring in the substrate due to contamination at the outer edge of the substrate.

The holding member switching mechanism may include a first magnetic force generating member that switches the holding members positioned in the first region to the substrate held state by a magnetic force, and a second magnetic force generating member that switches the holding member positioned in the second region to the substrate released state by a magnetic force.

In this case, utilizing the magnetic force allows the holding members positioned in the first region to be switched to the substrate held state while allowing the holding member positioned in the second region to be switched to the substrate released state with the first and second magnetic force generating members spaced apart from the holding member that moves. This prevents the configuration of the holding member switching mechanism from being complicated.

The first magnetic force generating member may include a first magnet member that is brought closer to or spaced apart from the holding members positioned in the first region to exert the magnetic force on the holding members positioned in the first region, and the second magnetic force generating member may include a second magnet member that is brought closer to or spaced apart from the holding member positioned in the second region to exert the magnetic force on the holding member positioned in the second region.

In this case, it is possible to reliably switch the holding members positioned in the first region to the substrate held state while switching the holding member positioned in the second region to the substrate released state in a simple configuration.

Each of the plurality of holding members may include a holder provided so as to be movable between an abutment position where it is abutted against the outer edge of the substrate and a spacing position where it is spaced apart from the outer edge of the substrate below the rotating member.

In this case, the holder in the holding member moves to the abutment position with the substrate arranged below the rotating member, so that the substrate is held below the rotating member. Therefore, a space where the lower surface of the substrate is to be cleaned is formed below the substrate. This makes it easy to clean the lower surface of the substrate.

According to another aspect of the present invention, a substrate cleaning apparatus may include a substrate holding and rotating device that rotates a substrate while holding the substrate, a first cleaner for cleaning an outer edge of the substrate, and a first cleaner moving mechanism that moves the first cleaner, in which the substrate holding and rotating device includes a rotating member provided so as to be rotatable around a rotation axis, a rotation-driving mechanism that rotates the rotating member, a plurality of holding members provided in the rotating member so as to be switchable between a substrate held state where they are abutted against the outer edge of the substrate to hold the substrate and a substrate released state where they are spaced apart from the outer edge of the substrate, and a plurality of holding members provided on the rotating member so as to be switchable between a substrate held state where they are abutted against the outer edge of the substrate to hold the substrate and a substrate released state where they are spaced apart from the outer edge of the substrate, and a holding member switching mechanism that switches the plurality of holding members between the substrate held state and the substrate released state, each of the plurality of holding members rotates around the rotation axis through a first region and a second region along the outer edge of the substrate as the rotation-driving mechanism rotates the rotating member, the holding member switching mechanism brings the holding members positioned in the first region out of the plurality of holding members into the substrate held state while bringing the holding member positioned in the second region out of the plurality of holding members into the substrate released state during the rotation of the rotating member, and the first cleaner moving mechanism moves the first cleaner to the second region when the holding members positioned in the first region is in the substrate held state while the holding member positioned in the second region is in the substrate released state.

In the substrate cleaning apparatus, the substrate holding and rotating device rotates the substrate while holding the substrate. The rotation-driving mechanism rotates the rotating member in the substrate holding and rotating device around the rotation axis. The plurality of holding members provided on the rotating member are switched by the holding member switching mechanism between the substrate held state where they are abutted against the outer edge of the substrate to hold the substrate and the substrate released state where they are spaced apart from the outer edge of the substrate.

During the rotation of the rotating member, the holding member switching mechanism brings the holding members positioned in the first region out of the plurality of holding members into the substrate held state, while bringing the holding member positioned in the second region out of the plurality of holding members into the substrate released state. In this case, the holding members positioned in the first region move with the substrate held therein, while the holding member positioned in the second region moves with the holding member spaced apart from the outer edge of the substrate. This causes a space to be formed between the outer edge of the substrate and the holding member that passes through the second region.

The first cleaner is moved to the space by the first cleaner moving mechanism, to come into contact with the outer edge of the substrate that rotates. This allows the whole outer edge of the substrate to be cleaned with the first cleaner, allowing a contaminant that adheres to the outer edge of the substrate to be reliably removed. As a result, it is possible to prevent processing defects from occurring in the substrate due to contamination at the outer edge of the substrate.

The substrate cleaning apparatus may further include a second cleaner for cleaning an upper surface or a lower surface of the substrate, and a second cleaner moving mechanism that moves the second cleaner, in which the second cleaner moving mechanism may move the second cleaner to the upper surface or the lower surface of the substrate through the second region when the holding members positioned in the first region is in the substrate held state while the holding member positioned in the second region is in the substrate released state.

In this case, the second cleaner can be moved to a position between the substrate and the rotating member through the second region while the holding members positioned in the first region rotates the substrate while holding the substrate. This allows the upper surface of the substrate to be cleaned with the second cleaner when the substrate is positioned below the rotating member, and the lower surface of the substrate to be cleaned with the second cleaner when the substrate is positioned above the rotating member.

The holding member switching mechanism may include a first magnetic force generating member that switches the holding members positioned in the first region to the substrate held state by a magnetic force, and a second magnetic force generating member that switches the holding member positioned in the second region to the substrate released state by a magnetic force.

In this case, utilizing the magnetic force allows the holding members positioned in the first region to be switched to the substrate held state while allowing the holding member positioned in the second region to the substrate released state with the first and second magnetic force generating members spaced apart from the holding member that moves. This prevents the configuration of the holding member switching mechanism from being complicated.

The first magnetic force generating member may include a first magnet member that is brought closer to or spaced apart from the holding members positioned in the first region to exert the magnetic force on the holding members positioned in the first region, and the second magnetic force generating member may include a second magnet member that is brought closer to or spaced apart from the holding member positioned in the second region to exert the magnetic force on the holding member positioned in the second region.

In this case, it is possible to reliably switch the holding members positioned in the first region to the substrate held state while switching the holding member positioned in the second region to the substrate released state in a simple configuration.

Each of the plurality of holding members may include a holder provided so as to be movable between an abutment position where it is abutted against the outer edge of the substrate and a spacing position where it is spaced apart from the outer edge of the substrate below the rotating member, and the substrate cleaning apparatus may further include a substrate supporting member that supports the substrate below the rotating member, and a supporting member lifting mechanism that lifts the substrate supporting member.

In this case, the substrate supporting member rises by the supporting member lifting mechanism with the substrate supported by the substrate supporting member. This causes the substrate to move to positions among the plurality of holding members. In this state, the holder in each of the holding members moves to the abutment position, so that the substrate can be held below the rotating member. Thereafter, the substrate supporting member falls, so that a space where the lower surface of the substrate is to be cleaned is formed below the substrate. This allows the lower surface of the substrate to be easily cleaned.

According to still another aspect of the present invention, a substrate processing apparatus that is arranged adjacent to an exposure device includes a processing section for subjecting a substrate to processing, and an interface for transferring and receiving the substrate between the processing section and the exposure device, in which at least one of the processing section and the interface includes a cleaning processing unit that subjects the substrate to cleaning processing, the cleaning processing unit includes a substrate holding and rotating device that rotates the substrate while holding the substrate, a cleaner for cleaning an outer edge of the substrate, and a cleaner moving mechanism that moves the cleaner, the substrate holding and rotating device includes a rotating member provided so as to be rotatable around a rotation axis, a rotation-driving mechanism that rotates the rotating member, a plurality of holding members provided on the rotating member so as to be switchable between a substrate held state where they are abutted against the outer edge of the substrate to hold the substrate and a substrate released state where they are spaced apart from the outer edge of the substrate, and a holding member switching mechanism that switches the plurality of holding members between the substrate held state and the substrate released state, each of the plurality of holding members rotates around the rotation axis through a first region and a second region along the outer edge of the substrate as the rotation-driving mechanism rotates the rotating member, the holding member switching mechanism brings the holding members positioned in the first region out of the plurality of holding members into the substrate held state while bringing the holding member positioned in the second region out of the plurality of holding members into the substrate released state during the rotation of the rotating member, and the cleaner moving mechanism moves the cleaner to the second region with the holding member switching mechanism switching the holding members in the first region to the substrate held state while switching the holding member in the second region to the substrate released state.

In the substrate processing apparatus, the processing section subjects the substrate to predetermined processing, and the interface receives and transfers the substrate from the processing section to the exposure device. After the exposure device subjects the substrate to exposure processing, the interface receives and transfers the substrate from the exposure device to the processing section. Before or after the exposure processing by the exposure device, the cleaning processing unit subjects the substrate to the cleaning processing.

In the substrate cleaning apparatus, the substrate holding and rotating device rotates the substrate while holding the substrate. The rotation-driving mechanism rotates the rotating member in the substrate holding and rotating device around the rotation axis. The plurality of holding members provided on the rotating member are switched by the holding member switching mechanism between the substrate held state where they are abutted against the outer edge of the substrate to hold the substrate and the substrate released state where they are spaced apart from the outer edge of the substrate.

During the rotation member of the rotating member, the holding member switching mechanism brings the holding members positioned in the first region out of the plurality of holding members into the substrate held state, while bringing the holding member positioned in the second region out of the plurality of holding members into the substrate released state. In this case, the holding members positioned in the first region move with the substrate held therein, while the holding member positioned in the second region moves with the holding member spaced apart from the outer edge of the substrate. This causes a space to be formed between the outer edge of the substrate and the holding member that passes through the second region.

The cleaner is moved to the space by the cleaner moving mechanism, to come into contact with the outer edge of the substrate that rotates. This allows the whole outer edge of the substrate to be cleaned with the cleaner, allowing a contaminant that adheres to the outer edge of the substrate to be removed. As a result, it is possible to prevent processing defects from occurring in the substrate due to contamination at the outer edge of the substrate.

When the cleaning processing unit cleans the outer edge of the substrate before the exposure processing by the exposure device, it is possible to prevent contamination in the exposure device due to the contamination at the outer edge of the substrate and to prevent defective patterns such as a defective dimension and a defective shape. When the cleaning processing unit cleans the outer edge of the substrate after the exposure processing by the exposure device, it is possible to prevent development defects from occurring during development of an exposure pattern.

According to the present invention, it is possible to clean the whole of the outer edge of the substrate. This can prevent processing defects from occurring in the substrate due to the contamination at the outer edge of the substrate.

Other features, elements, characteristics, and advantages of the present invention will become more apparent from the following description of various embodiments of the present invention with reference to the attached drawings.

BRIEF DESCRIPTION OF THE DRAWINGS

FIG. 8 is a diagram for explaining an operation for holding a substrate W by a spin chuck;

FIG. 12 is a side view showing the configuration of a cleaning processing unit;

FIG. 13 is a schematic side view showing the configuration of a cleaning processing unit; and FIG. 14 is a side view and a schematic plan view for explaining top surface cleaning processing for a substrate W using a top surface cleaning brush.

DETAILED DESCRIPTION OF THE INVENTION

A substrate holding and rotating device according to an embodiment of the present invention, and a substrate cleaning apparatus and a substrate processing apparatus including the same will be described with reference to the drawings. In the following description, a substrate refers to a semiconductor substrate, a substrate for a liquid crystal display, a substrate for a plasma display, a glass substrate for a photomask, a substrate for an optical disk, a substrate for a magnetic disk, a substrate for a magneto-optical disk, a substrate for a photomask, or the like.

Figure 1:
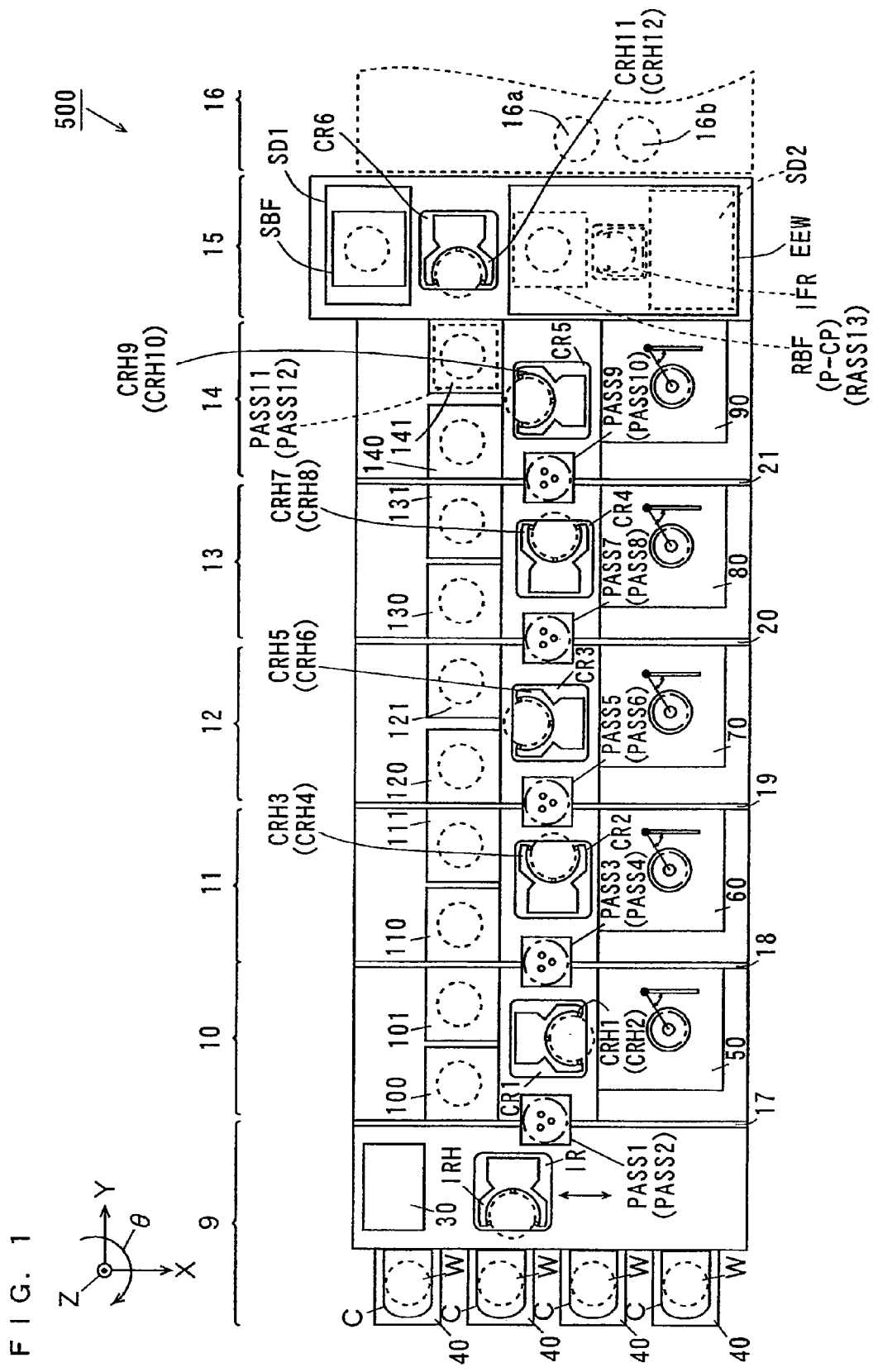
FIG. 1 is a plan view of a substrate processing apparatus according to a first embodiment of the present invention.

FIG. 1 is a plan view of a substrate processing apparatus according to a first embodiment of the present invention. FIG. 1 and FIGS. 2 to 4 described later are accompanied by arrows that respectively indicate X, Y, and Z directions perpendicular to one another for clarity of a positional relationship. The X and Y directions are perpendicular to each other within a horizontal plane, and the Z direction corresponds to the vertical direction. In each of the directions, the direction of the arrow is defined as a + direction, and the opposite direction is defined as a − direction. A rotation direction centered around the Z direction is defined as a θ direction.

As shown in FIG. 1, a substrate processing apparatus 500 includes an indexer block 9, an anti-reflection film processing block 10, a resist film processing block 11, a development processing block 12, a resist cover film processing block 13, a resist cover film removal block 14, and an interface block 15. An exposure device 16 is arranged adjacent to the interface block 15. The exposure device 16 subjects a substrate W to exposure processing by means of a liquid immersion method.

Each of the indexer block 9, the anti-reflection film processing block 10, the resist film processing block 11, the development processing block 12, the resist cover film processing block 13, the resist cover film removal block 14, and the interface block 15 will be hereafter referred to as a processing block.

The indexer block 9 includes a main controller (controller) 30 that controls the operation of each of the processing blocks, a plurality of carrier platforms 40, and an indexer robot IR. The indexer robot IR has a hand IRH provided for receiving and transferring the substrates W.

The anti-reflection film processing block 10 includes thermal processing groups 100 and 101 for anti-reflection film, a coating processing group 50 for anti-reflection film, and a first central robot CR1. The coating processing group 50 is opposed to the thermal processing groups 100 and 101 with the first central robot CR1 sandwiched therebetween. The first central robot CR1 has hands CRH1 and CRH2 provided one above the other for receiving and transferring the substrates W.

A partition wall 17 is provided between the indexer block 9 and the anti-reflection film processing block 10 for shielding an atmosphere. The partition wall 17 has substrate platforms PASS1 and PASS2 provided in close proximity one above the other for receiving and transferring the substrates W between the indexer block 9 and the anti-reflection film processing block 10. The upper substrate platform PASS1 is used in transporting the substrates W from the indexer block 9 to the anti-reflection film processing block 10, and the lower substrate platform PASS2 is used in transporting the substrates W from the anti-reflection film processing block 10 to the indexer block 9.

Each of the substrate platforms PASS1 and PASS2 is provided with an optical sensor (not shown) for detecting the presence or absence of the substrate W. This allows determination whether or not the substrate W is placed on the substrate platform PASS1 or PASS2. Furthermore, each of the substrate platforms PASS1 and PASS2 has a plurality of support pins secured thereto. Note that each of substrate platforms PASS3 to PASS13 described later is similarly provided with an optical sensor and support pins.

The resist film processing block 11 includes thermal processing groups 110 and 111 for resist film, a coating processing group 60 for resist film, and a second central robot CR2. The coating processing group 60 is opposed to the thermal processing groups 110 and 111 with the second central robot CR2 sandwiched therebetween. The second central robot CR2 has hands CRH3 and CRH4 provided one above the other for receiving and transferring the substrates W.

A partition wall 18 is provided between the anti-reflection film processing block 10 and the resist film processing block 11 for shielding an atmosphere. The partition wall 18 has substrate platforms PASS3 and PASS4 provided in close proximity one above the other for receiving and transferring the substrates W between the anti-reflection film processing block 10 and the resist film processing block 11. The upper substrate platform PASS3 is used in transporting the substrates W from the anti-reflection film processing block 10 to the resist film processing block 11, and the lower substrate platform PASS4 is used in transporting the substrates W from the resist film processing block 11 to the anti-reflection film processing block 10.

The development processing block 12 includes thermal processing groups 120 and 121 for development, a development processing group 70, and a third central robot CR3. The development processing group 70 is opposed to the thermal processing groups 120 and 121 with the third central robot CR3 sandwiched therebetween. The third central robot CR3 has hands CRH5 and CRH6 provided one above the other for receiving and transferring the substrates W.

A partition wall 19 is provided between the resist film processing block 11 and the development processing block 12 for shielding an atmosphere. The partition wall 19 has substrate platforms PASS5 and PASS6 provided in close proximity one above the other for receiving and transferring the substrates W between the resist film processing block 11 and the development processing block 12. The upper substrate platform PASS5 is used in transporting the substrates W from the resist film processing block 11 to the development processing block 12, and the lower substrate platform PASS6 is used in transporting the substrates W from the development processing block 12 to the resist film processing block 11.

The resist cover film processing block 13 includes thermal processing groups 130 and 131 for resist cover film, a coating processing group 80 for resist cover film, and a fourth central robot CR4. The coating processing group 80 is opposed to the thermal processing groups 130 and 131 with the fourth central robot CR4 sandwiched therebetween. The fourth central robot CR4 has hands CRH7 and CRH8 provided one above the other for receiving and transferring the substrates W.

A partition wall 20 is provided between the development processing block 12 and the resist cover film processing block 13 for shielding an atmosphere. The partition wall 20 has substrate platforms PASS7 and PASS8 provided in close proximity one above the other for receiving and transferring the substrates W between the development processing block 12 and the resist cover film processing block 13. The upper substrate platform PASS7 is used in transporting the substrates W from the development processing block 12 to the resist cover film processing block 13, and the lower substrate platform PASS8 is used in transporting the substrates W from the resist cover film processing block 13 to the development processing block 12.

The resist cover film removal block 14 includes thermal processing groups 140 and 141 for post-exposure bake, a removal processing group 90 for resist cover film, and a fifth central robot CR5. The thermal processing group 141 is adjacent to the interface block 15, and includes substrate platforms PASS11 and PASS12, as described later. The removal processing group 90 is opposed to the thermal processing groups 140 and 141 with the fifth central robot CR5 sandwiched therebetween. The fifth central robot CR5 has hands CRH9 and CRH10 provided one above the other for receiving and transferring the substrates W.

A partition wall 21 is provided between the resist cover film processing block 13 and the resist cover film removal block 14 for shielding an atmosphere. The partition wall 21 has substrate platforms PASS9 and PASS10 provided in close proximity one above the other for receiving and transferring the substrates W between the resist cover film processing block 13 and the resist cover film removal block 14. The upper substrate platform PASS9 is used in transporting the substrates W from the resist cover film processing block 13 to the resist cover film removal block 14, and the lower substrate platform PASS10 is used in transporting the substrates W from the resist cover film removal block 14 to the resist cover film processing block 13.

The interface block 15 includes a sending buffer unit SBF, cleaning/drying processing units SD1, a sixth central robot CR6, an edge exposure unit EEW, a return buffer unit RBF, placement/cooling units PASS-CP (hereinafter abbreviated as P-CP), a substrate platform PASS13, an interface transport mechanism IFR, and cleaning/drying processing units SD2. The cleaning/drying processing unit SD1 subjects the substrate W before exposure processing to cleaning and drying processing, and the cleaning/drying processing SD2 subjects the substrate W after exposure processing to cleaning and drying processing. The details of the cleaning/drying processing units SD1 and SD2 will be described later.

The sixth central robot CR6 has hands CRH11 and CRH12 (see FIG. 4) provided one above the other for receiving and transferring the substrates W, and the interface transport mechanism IFR has hands H1 and H2 (see FIG. 4) provided one above the other for receiving and transferring the substrates W. The details of the interface block 15 will be described later.

In the substrate processing apparatus 500 according to the present embodiment, the indexer block 9, the anti-reflection film processing block 10, the resist film processing block 11, the development processing block 12, the resist cover film processing block 13, the resist cover film removal block 14, and the interface block 15 are provided side by side in this order in the Y direction.

Figure 2:
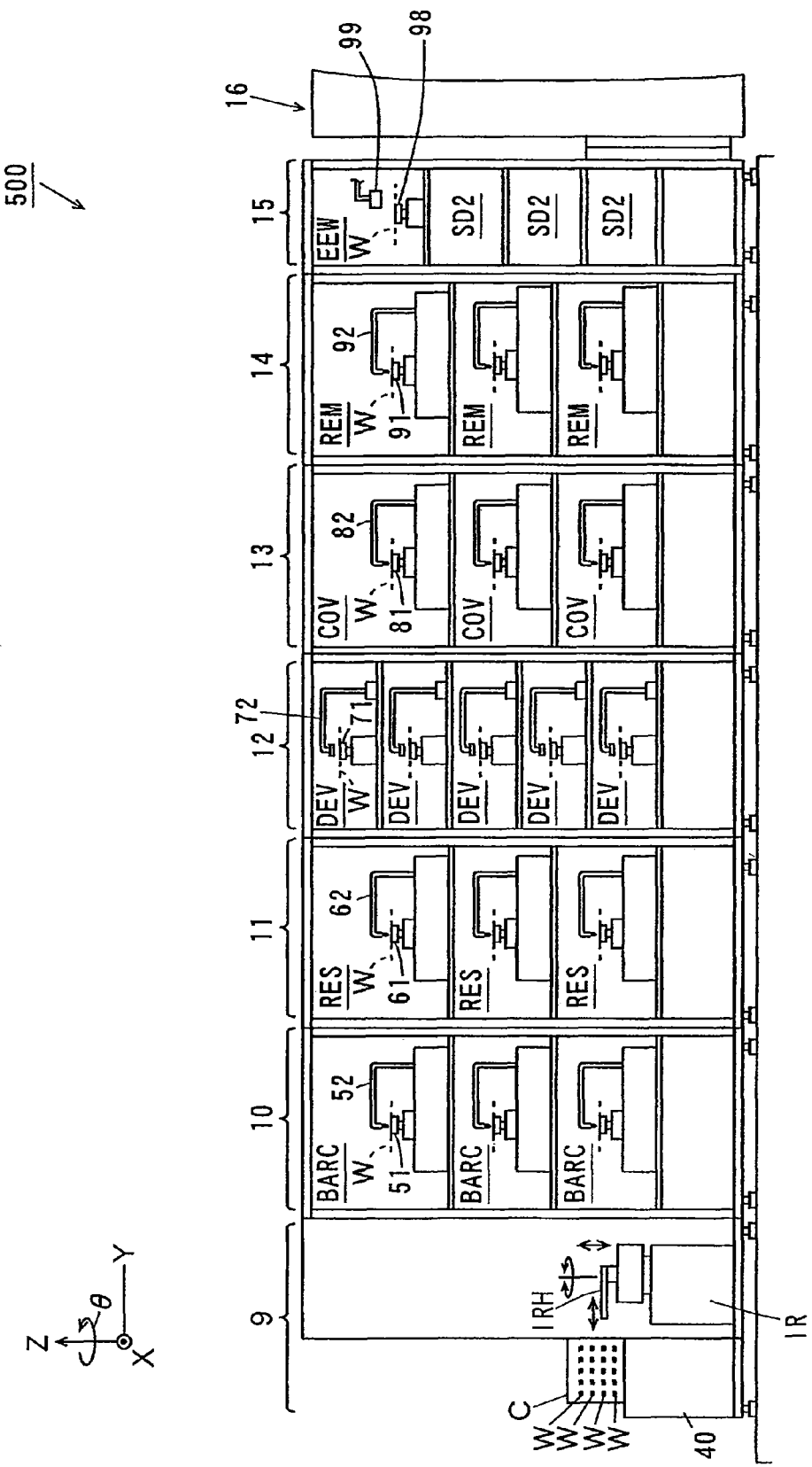
FIG. 2 is a schematic side view of the substrate processing apparatus shown in FIG. 1 as viewed from the +X direction.
Figure 3:
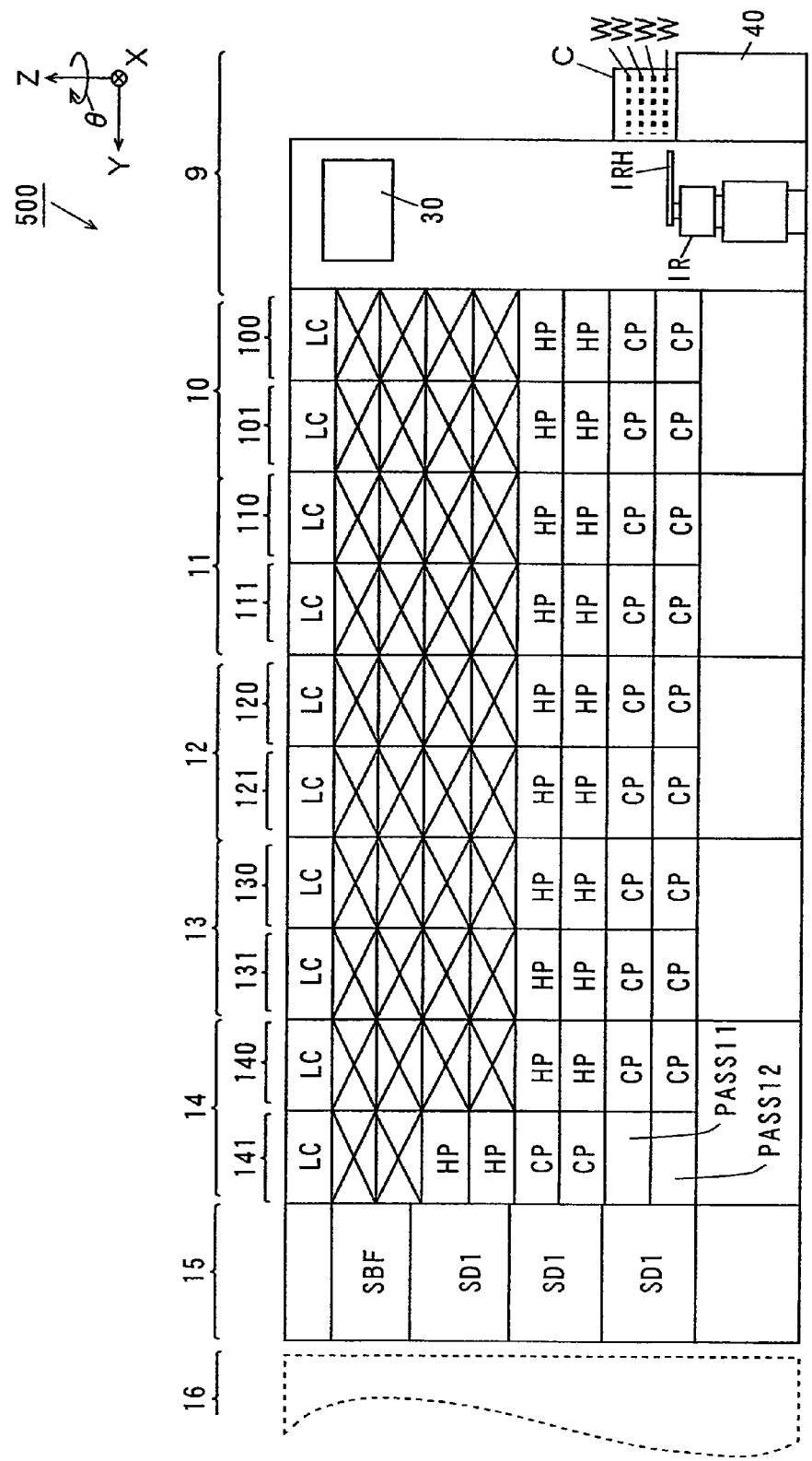
FIG. 3 is a schematic side view of the substrate processing apparatus shown in FIG. 1 as viewed from the −X direction.

FIG. 2 is a schematic side view of the substrate processing apparatus 500 shown in FIG. 1 as viewed from the +X direction, and FIG. 3 is a schematic side view of the substrate processing apparatus 500 shown in FIG. 1 as viewed from the −X direction. FIG. 2 mainly shows the configuration on the +X side of the substrate processing apparatus 500, and FIG. 3 mainly shows the configuration on the −X side of the substrate processing apparatus 500.

Description is first made of the configuration on the +X side of the substrate processing apparatus 500 using FIG. 2. As shown in FIG. 2, the coating processing group 50 in the anti-reflection film processing block 10 (see FIG. 1) has a vertical stack of three coating units BARC. Each of the coating units BARC includes a spin chuck 51 for rotating the substrate W with the substrate W held in a horizontal attitude by suction, and a supply nozzle 52 for supplying a coating liquid for an anti-reflection film to the substrate W held on the spin chuck 51.

The coating processing group 60 in the resist film processing block 11 (see FIG. 1) has a vertical stack of three coating units RES. Each of the coating units RES includes a spin chuck 61 for rotating the substrate W with the substrate W held in a horizontal attitude by suction, and a supply nozzle 62 for supplying a coating liquid for a resist film to the substrate W held on the spin chuck 61.

The development processing group 70 in the development processing block 12 has a vertical stack of five development processing units DEV. Each of the development processing units DEV includes a spin chuck 71 for rotating the substrate W with the substrate W held in a horizontal attitude by suction, and a supply nozzle 72 for supplying a development liquid to the substrate W held on the spin chuck 71.

The coating processing group 80 in the resist cover film processing block 13 has a vertical stack of three coating units COV. Each of the coating units COV includes a spin chuck 81 for rotating the substrate W with the substrate W held in a horizontal attitude by suction, and a supply nozzle 82 for supplying a coating liquid for a resist cover film to the substrate W held on the spin chuck 81. Materials having a low affinity for resists and water (materials having low reactivity to resists and water) can be used as the coating liquid for the resist cover film. An example of the coating liquid is fluororesin. Each of the coating units COV forms the resist cover film on the resist film formed on the substrate W by applying the coating liquid onto the substrate W while rotating the substrate W.

The removal processing group 90 in the resist cover film removal block 14 has a vertical stack of three removal units REM. Each of the removal units REM includes a spin chuck 91 for rotating the substrate W with the substrate W held in a horizontal attitude by suction, and a supply nozzle 92 for supplying a stripping liquid (e.g. fluororesin) to the substrate W held on the spin chuck 91. Each of the removal units REM removes the resist cover film formed on the substrate W by applying the stripping liquid onto the substrate W while rotating the substrate W.

Note that the method of removing the resist cover films in the removal units REM is not limited to the above-mentioned examples. For example, the resist cover film may be removed by supplying the stripping liquid onto the substrate W while moving a slit nozzle above the substrate W.

The interface block 15 has a vertical stack of an edge exposure unit EEW and three cleaning/drying processing units SD2 on the +X side. The edge exposure unit EEW includes a spin chuck 98 for rotating the substrate W with the substrate held in a horizontal attitude by suction, and a light irradiator 99 for exposing a peripheral portion of the substrate W held on the spin chuck 98.

Description is now made of the configuration on the −X side of the substrate processing apparatus 500 using FIG. 3. As shown in FIG. 3, each of the thermal processing groups 100 and 101 in the anti-reflection film processing block 10 has a stack of two heating units (hot plates) HP and two cooling units (cooling plates) CP. Each of the thermal processing groups 100 and 101 has a local controller LC for controlling the respective temperatures of the heating units HP and the cooling units CP arranged in its uppermost part.

Each of the thermal processing groups 110 and 111 in the resist film processing block 11 has a stack of two heating units HP and two cooling units CP. Each of the thermal processing groups 110 and 111 also has a local controller LC for controlling the respective temperatures of the heating units HP and the cooling units CP arranged in its uppermost part.

Each of the thermal processing groups 120 and 121 in the development processing block 12 has a stack of two heating units HP and two cooling units CP. Each of the thermal processing groups 120 and 121 also has a local controller LC for controlling the respective temperatures of the heating units HP and the cooling units CP arranged in its uppermost part.

Each of the thermal processing groups 130 and 131 in the resist cover film processing block 13 has a stack of two heating units HP and two cooling units CP. Each of the thermal processing groups 130 and 131 also has a local controller LC for controlling the respective temperatures of the heating units HP and the cooling units CP arranged in its uppermost part.

In the resist cover film removal block 14, the thermal processing group 140 has a vertical stack of two heating units HP and two cooling units CP, and the thermal processing group 141 has a vertical stack of two heating units HP, two cooling units CP, and substrate platforms PASS11 and PASS12. Each of the thermal processing groups 140 and 141 has a local controller LC for controlling the respective temperatures of the heating units HP and the cooling units CP arranged in its uppermost part.

The interface block 15 will now be described in detail using FIG. 4.

Figure 4:
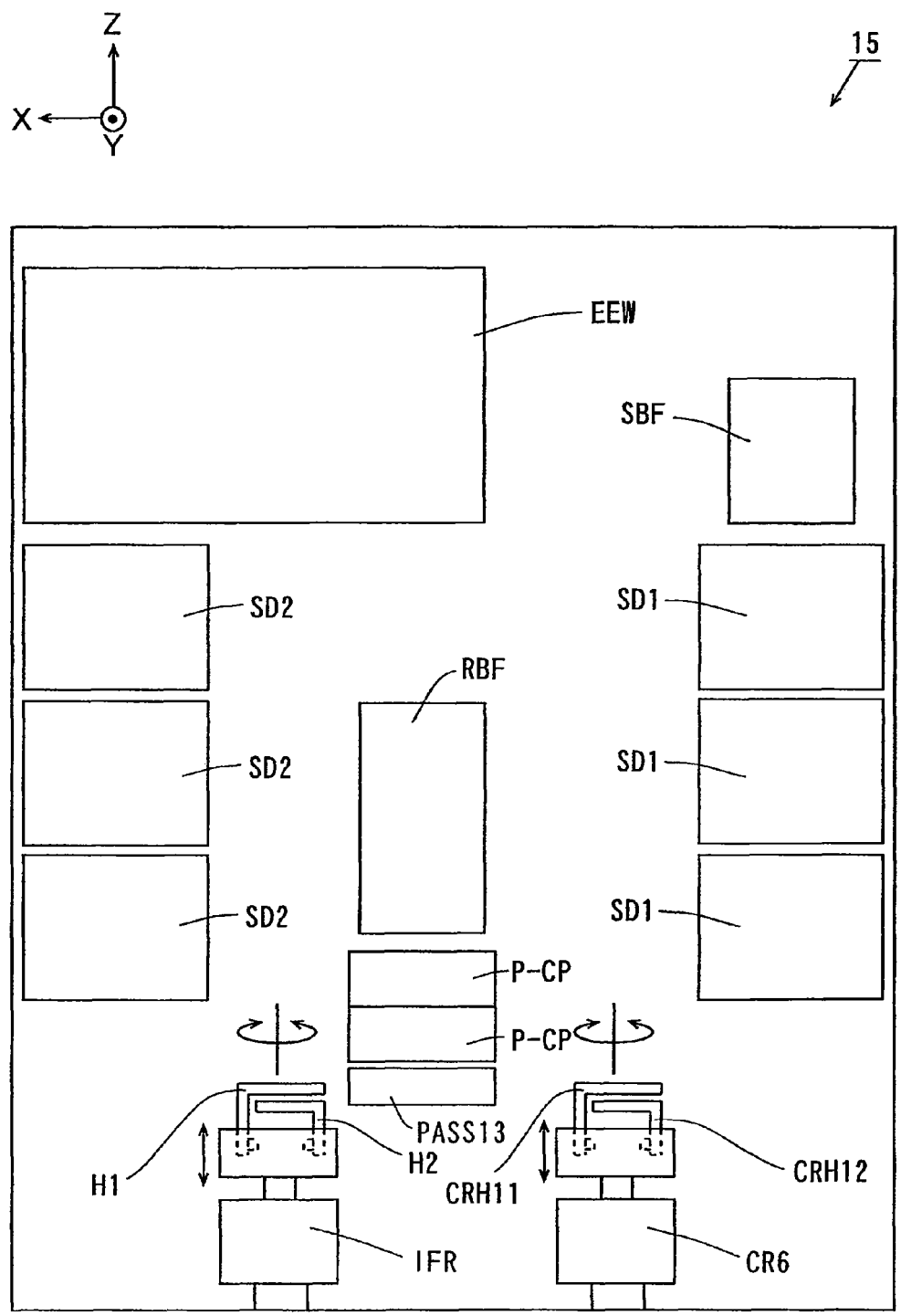
FIG. 4 is a schematic side view of an interface block as viewed from the +Y side.

FIG. 4 is a schematic side view of the interface block 15 as viewed from the +Y side. As shown in FIG. 4, the interface block 15 has a stack of the sending buffer unit SBF and the three cleaning/drying processing units SD1 on the −X side. The interface block 15 has an edge exposure unit EEW arranged on the +X side in its upper part.

The interface block 15 has a vertical stack of a return buffer unit RBF, two placement/cooling units P-CP, and a substrate platform PASS13 at its substantially central portion below the edge exposure unit EEW. The interface block 15 has a vertical stack of three cleaning/drying processing units SD2 arranged on the +X side below the edge exposure unit EEW.

A sixth central robot CR6 and an interface transport mechanism IFR are provided in a lower part of the interface block 15. The sixth central robot CR6 is provided so as to be vertically movable and rotatable in an area among the sending buffer unit SBF, the cleaning/drying processing units SD1, the edge exposure unit EEW, the return buffer unit RBF, the placement/cooling units P-CP, and the substrate platform PASS13. The interface transport mechanism IFR is provided so as to be vertically movable and rotatable in an area among the return buffer unit RBF, the placement/cooling units P-CP, the substrate platform PASS13, and the cleaning/drying processing units SD2.

The operation of the substrate processing apparatus 500 according to the present embodiment will now be described with reference to FIGS. 1 to 4.

First, the operations of the indexer block 9 to the resist cover film removal block 14 will be briefly described.

Carriers C that store a plurality of substrates W in a multiple stage are respectively carried onto the carrier platforms 40 in the indexer block 9. The indexer robot IR takes out the unprocessed substrate W that is stored in the carrier C using the hand IRH. Thereafter, the indexer robot IR rotates in the ±θ direction while moving in the ±X direction, to place the unprocessed substrate W on the substrate platform PASS1.

Although FOUPs (Front Opening Unified Pods) are adopted as the carriers C in the present embodiment, the present invention is not limited to the same. For example, SMIF (Standard Mechanical Inter Face) pods, OCs (Open Cassettes) that expose the stored substrates W to outside air, and so on may be used.

Furthermore, although linear-type transport robots that move their hands forward or backward by linearly sliding them to the substrate W are respectively used as the indexer robot IR, the first to sixth central robots CR1 to CR6, and the interface transport mechanism IFR, the present invention is not limited to the same. For example, multi-joint type transport robots that linearly move their hands forward and backward by moving their joints may be used.

The unprocessed substrate W placed on the substrate platform PASS1 is received by the first central robot CR1 in the anti-reflection film processing block 10. The first central robot CR1 carries the substrate W into the thermal processing group 100 or 101.

Thereafter, the first central robot CR1 takes out the thermally processed substrate W from the thermal processing group 100 or 101 and carries the substrate W into the coating processing group 50. In the coating processing group 50, the coating unit BARC forms a coating of an anti-reflection film on the substrate W in order to reduce standing waves and halation generated during the exposure processing.

The first central robot CR1 then takes out the substrate W after the coating processing from the coating processing group 50 and carries the substrate W into the thermal processing group 100 or 101. Thereafter, the first central robot CR1 takes out the thermally processed substrate W from the thermal processing group 100 or 101 and places the substrate W on the substrate platform PASS3.

The substrate W placed on the substrate platform PASS3 is received by the second central robot CR2 in the resist film processing block 11. The second central robot CR2 carries the substrate W into the thermal processing group 110 or 110.

Thereafter, the second central robot CR2 takes out the thermally processed substrate W from the thermal processing group 110 or 111 and carries the substrate W into the coating processing group 60. In the coating processing group 60, the coating unit RES forms a coating of a resist film on the substrate W that has been coated with the anti-reflection film.

The second central robot CR2 then takes out the substrate W after the coating processing from the coating processing group 60 and carries the substrate W into the thermal processing group 110 or 111. Thereafter, the second central robot CR2 takes out the thermally processed substrate W from the thermal processing group 110 or 111 and places the substrate W on the substrate platform PASS5.

The substrate W placed on the substrate platform PASS5 is received by the third central robot CR3 in the development processing block 12. The third central robot CR3 places the substrate W on the substrate platform PASS7.

The substrate W placed on the substrate platform PASS7 is received by the fourth central robot CR4 in the resist cover film processing block 13. The fourth central robot CR4 carries the substrate W into the coating processing group 80. In the coating processing group 80, the coating unit COV forms a coating of a resist cover film on the substrate W that has been coated with the resist film. The formation of the resist cover film prevents the resist film from coming into contact with a liquid even if the substrate W comes into contact with the liquid in the exposure device 16 while preventing a component of a resist from being eluted in the liquid.

The fourth central robot CR4 then takes out the substrate W after the coating processing from the coating processing group 80 and carries the substrate W into the thermal processing group 130 or 131. Thereafter, the fourth central robot CR4 takes out the thermally processed substrate W from the thermal processing group 130 or 131 and places the substrate W on the substrate platform PASS9.

The substrate W placed on the substrate platform PASS9 is received by the fifth central robot CR5 in the resist cover film removal block 14. The fifth central robot CR5 places the substrate W on the substrate platform PASS11.

The substrate W placed on the substrate platform PASS11 is received by the sixth central robot CR6 in the interface block 15, and is subjected to predetermined processing in the interface block 15 and the exposure device 16, as described later. After the substrate W is subjected to the predetermined processing in the interface block 15 and the exposure device 16, the sixth central robot CR6 carries the substrate W into the thermal processing group 141 in the resist cover film removal block 14.

In the thermal processing group 141, the substrate W is subjected to post-exposure bake (PEB). Thereafter, the sixth central robot CR6 takes out the substrate W from the thermal processing group 141 and places the substrate W on the substrate platform PASS12.

Although the substrate W is subjected to the post-exposure bake in the thermal processing group 141 in the present embodiment, the substrate W may be subjected to post-exposure bake in the thermal processing group 140.

The substrate W placed on the substrate platform PASS12 is received by the fifth central robot CR5 in the resist cover film removal block 14. The fifth central robot CR5 carries the substrate W into the removal processing group 90. In the removal processing group 90, the resist cover film is removed.

The fifth central robot CR5 then takes out the processed substrate W from the removal processing group 90 and places the substrate W on the substrate platform PASS10.

The substrate W placed on the substrate platform PASS10 is placed on the substrate platform PASS8 by the fourth central robot CR4 in the resist cover film processing block 13.

The substrate W placed on the substrate platform PASS8 is received by the third central robot CR3 in the development processing block 12. The third central robot CR3 carries the substrate W into the development processing group 70. In the development processing group 70, the exposed substrate W is subjected to development processing.

The third central robot CR3 then takes out the substrate W after the development processing from the development processing group 70 and carries the substrate W into the thermal processing group 120 or 121. Thereafter, the third central robot CR3 takes out the thermally processed substrate W from the thermal processing group 120 or 121 and places the substrate W on the substrate platform PASS6.

The substrate W placed on the substrate platform PASS6 is placed on the substrate platform PASS4 by the second central robot CR2 in the resist film processing block 11. The substrate W placed on the substrate platform PASS4 is placed on the substrate platform PASS2 by the first central robot CR1 in the anti-reflection film processing block 10.

The substrate W placed on the substrate platform PASS2 is stored in the carrier C by the indexer robot IR in the indexer block 9. Processing for the substrate W in the substrate processing apparatus 500 is thus terminated.

The operation of the interface block 15 will now be described in detail.

As described in the foregoing, the substrate W carried into the indexer block 9 is subjected to predetermined processing, and is then placed on the substrate platform PASS11 in the resist cover film removal block 14 (FIG. 1).

The substrate W placed on the substrate platform PASS11 is received by the sixth central robot CR6 in the interface block 15. The sixth central robot CR6 carries the substrate W into the edge exposure unit EEW (FIG. 4). In the edge exposure unit EEW, a peripheral portion of the substrate W is subjected to exposure processing.

The sixth central robot CR6 then takes out the substrate W after the exposure processing from the edge exposure unit EEW and carries the substrate W into any one of the cleaning/drying processing units SD1. In the cleaning/drying processing unit SD1, the substrate W before the exposure processing is subjected to cleaning and drying processing, as described above.

Here, a time period for the exposure processing by the exposure device 16 is ordinarily longer than those for other processing and transporting processes. As a result, the exposure device 16 cannot accept the subsequent substrates W in many cases. In this case, the substrate W is temporarily stored in the sending buffer unit SBF (FIG. 4). In the present embodiment, the sixth central robot CR6 takes out the substrate W after the cleaning and drying processing from the cleaning/drying processing unit SD1 and transports the substrate W to the sending buffer unit SBF.

The sixth central robot CR6 then takes out the substrate W stored in the sending buffer unit SBF and carries the substrate W into the placement/cooling unit P-CP. The substrate W carried into the placement/cooling unit P-CP is kept at the same temperature as that in the exposure device 16 (for example, 23° C.).

In a case where the exposure device 16 has a sufficient processing speed, the substrate W need not be stored in the sending buffer unit SBF but may be transported to the placement/cooling unit P-CP from the cleaning/drying processing unit SD1.

The substrate W kept at the above-mentioned predetermined temperature in the placement/cooling unit P-CP is then received with the upper hand H1 of the interface transport mechanism IFR (FIG. 4) and carried into a substrate inlet 16a in the exposure device 16 (FIG. 1).

The substrate W that has been subjected to the exposure processing in the exposure device 16 is carried out of a substrate outlet 16b (FIG. 1) with the lower hand H2 of the interface transport mechanism IFR (FIG. 4). The interface transport mechanism IFR carries the substrate W into any one of the cleaning/drying processing units SD2 with the hand H2. In the cleaning/drying processing unit SD2, the substrate W after the exposure processing is subjected to cleaning and drying processing, as described above.

The substrate W that has been subjected to the cleaning and drying processing in the cleaning/drying processing unit SD2 is taken out with the hand H1 of the interface transport mechanism IFR (FIG. 4). The interface transport mechanism IFR places the substrate W on the substrate platform PASS13 with the hand H1.

The substrate W placed on the substrate platform PASS13 is received by the sixth central robot CR6. The sixth central robot CR6 transports the substrate W to the thermal processing group 141 in the resist cover film removal block 14 (FIG. 1).

Note that when the resist cover film removal block 14 cannot temporarily receive the substrate W due to a failure or the like in the removal unit REM (FIG. 2), the substrate W after the exposure processing can be temporarily stored in the return buffer unit RBF.

Here, although in the present embodiment, the sixth central robot CR6 transports the substrate W among the substrate platform PASS11 (FIG. 1), the edge exposure unit EEW, the cleaning/drying processing units SD1, the sending buffer unit SBF, the placement/cooling units P-CP, the substrate platform PASS13, and the thermal processing group 141, a series of such operations can be performed in a short time (e.g., 24 seconds).

Although the interface transport mechanism IFR transports the substrate W among the placement/cooling units P-CP, the exposure device 16, the cleaning/drying processing units SD2, and the substrate platform PASS13, a series of such operations can be performed in a short time (e.g., 24 seconds).

As a result of these, throughput can be reliably improved.

Figure 5:
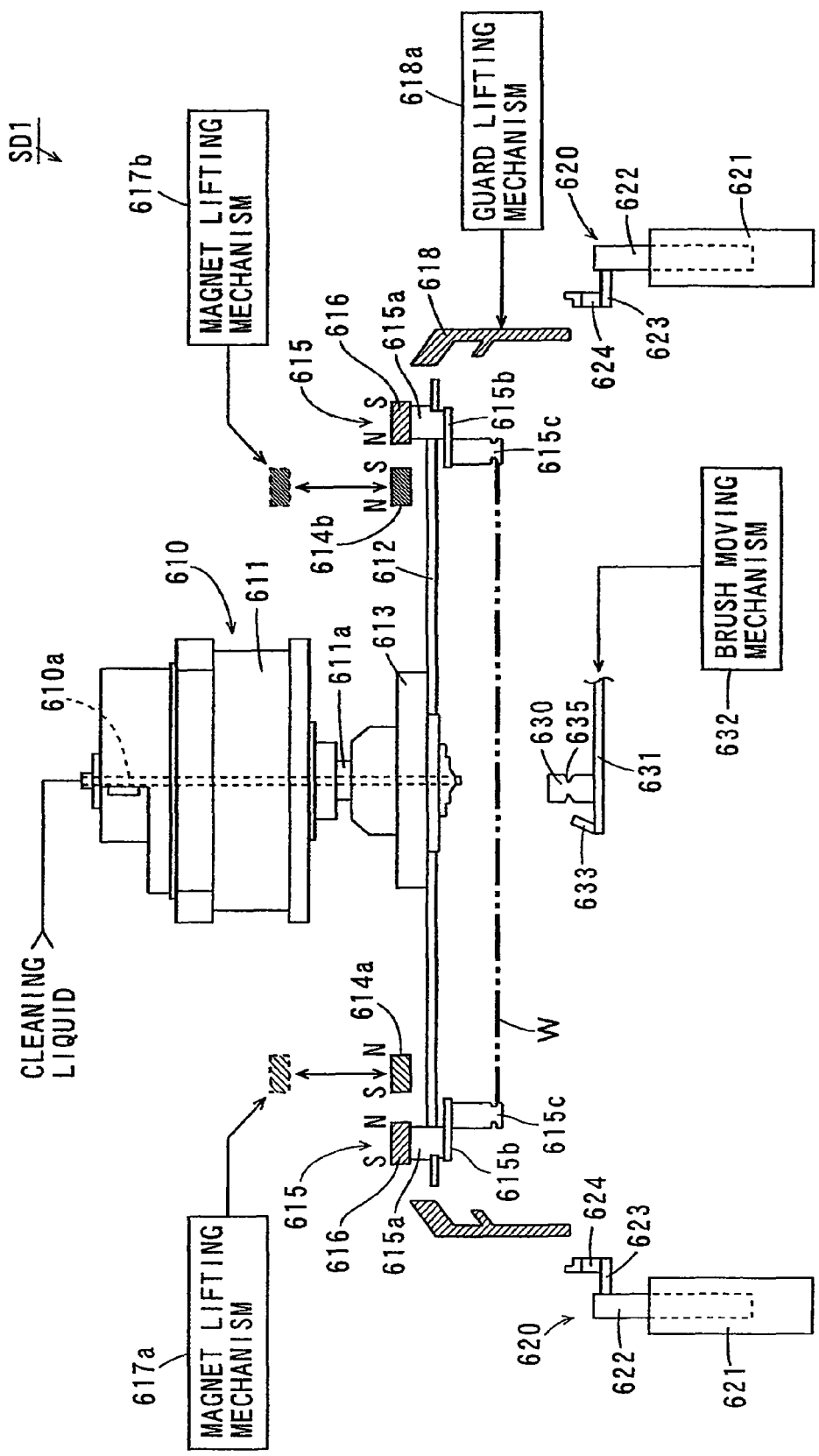
FIG. 5 is a side view showing the configuration of a cleaning/drying processing unit.
Figure 6:
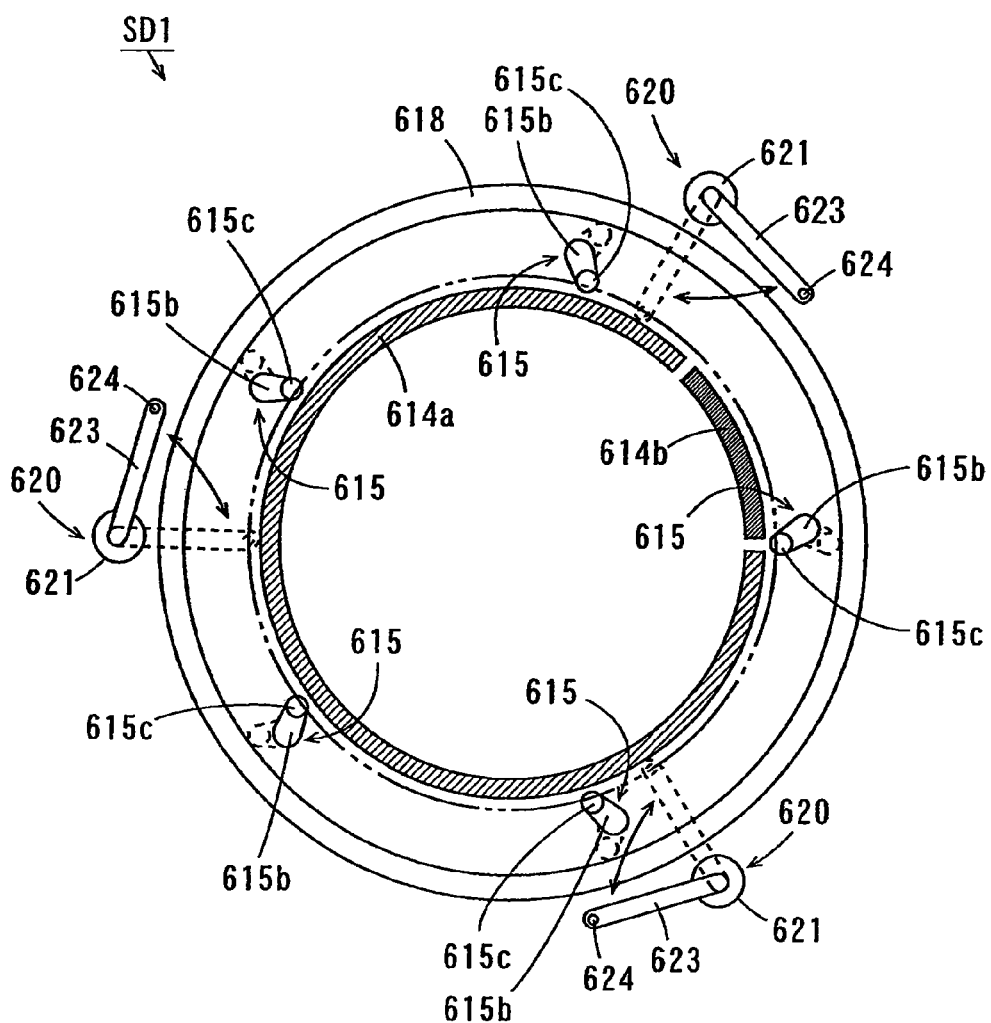
FIG. 6 is a schematic plan view showing the configuration of a cleaning/drying processing unit.

The cleaning/drying processing unit SD1 will now be described with reference to the drawings. FIGS. 5 and 6 are respectively a side view and a schematic plan view showing the configuration of the cleaning/drying processing unit SD1. FIG. 6 schematically shows some of constituent elements in the cleaning/drying processing unit SD1. The cleaning/drying processing unit SD2 has the same configuration as the cleaning/drying processing unit SD1.

As shown in FIGS. 5 and 6, the cleaning/drying processing unit SD1 includes a spin chuck 610 that rotates the substrate W with the substrate W held horizontally. The spin chuck 610 includes a spin motor 611, a rotating shaft 611a, a disk-shaped spin plate 612, a plate supporting member 613, magnet plates 614a and 614b, and a plurality of chuck pins 615.

The spin motor 611 is provided in an upper part of the cleaning/drying processing unit SD1. The spin motor 611 is supported by a supporting member (not shown). The rotating shaft 611a is provided so as to extend downward from the spin motor 611. The plate supporting member 613 is attached to a lower end of the rotating shaft 611a. The plate supporting member 613 supports the spin plate 612 horizontally. The spin motor 611 causes the rotating shaft 611a to rotate, causing the spin plate 612 to rotate around a vertical axis.

A liquid supply pipe 610a is inserted through the spin motor 611, the rotating shaft 611a, and the plate supporting member 613. A cleaning liquid can be supplied onto the substrate W held by the spin chuck 610 through the liquid supply pipe 610a. An example of the cleaning liquid is pure water.

A plurality of (five in this example) chuck pins 615 are equiangularly spaced with respect to the rotating shaft 611a in a peripheral portion of the spin plate 612. It is desirable that the number of chuck pins 615 is not less than five. The reason for this will be described later.

Each of the chuck pins 615 includes a shaft 615a, a pin supporter 615b, a holder 615c, and a magnet 616. The shaft 615a is provided so as to penetrate the spin plate 612, and the pin supporter 615b extending in the horizontal direction is connected to a lower end of the shaft 615a. The holder 615c is provided so as to project downward from a tip of the pin supporter 615b. Furthermore, the magnet 616 is attached to an upper end of the shaft 615a on an upper surface of the spin plate 612.

Each of the chuck pins 615 is rotatable around the vertical axis with the shaft 615a used as its center, and is switchable between a closed state where the holder 615c is abutted against an outer edge of the substrate W and an opened state where the holder 615c is spaced apart from the outer edge of the substrate W. Note that each of the chuck pins 615 enters the closed state when the N pole of the magnet 616 is on the inner side, while entering the opened state when the S pole of the magnet 616 is on the inner side in this example.

The magnet plates 614a and 614b are arranged along the circumference direction with the rotating shaft 611a used as its center above the spin plate 612. Each of the magnet plates 614a and 614b has the S pole and the N pole, respectively, on the outer side and the inner side. The magnet plates 614a and 614b are independently lifted, respectively, by the magnet lifting mechanisms 617a and 617b, and move between an upper position higher than the magnet 616 in the chuck pin 615 and a lower position substantially equal in height to the magnet 616 in the chuck pin 615.

Each of the chuck pins 615 is switched between the opened state and the closed state by lifting the magnet plates 614a and 614b. The details of the operations of the magnet plates 614a and 614b and the chuck pin 615 will be described later.

A guard 618 for receiving a cleaning liquid scattered from the substrate W is provided outside the spin chuck 610. The guard 618 is shaped to be rotationally-symmetric with respect to the rotating shaft 611a in the spin chuck 610. Furthermore, the guard 618 is lifted by the guard lifting mechanism 618a. The cleaning liquid received by the guard 618 is discharged or recovered by a liquid discharge device or a recovery device (not shown).

Three or more (three in this example) substrate interface mechanisms 620 are equiangularly spaced with the rotating shaft 611a in the spin chuck 610 used as its center outside the guard 618. Each of the substrate interface mechanisms 620 includes a lifting and rotation driver 621, a rotating shaft 622, an arm 623, and a holding pin 624. The rotating shaft 622 is provided so as to extend upward from the lifting and rotation driver 621, and the arm 623 is connected thereto so as to extend in the horizontal direction from an upper end of the rotating shaft 622. The holding pin 624 for holding the outer edge of the substrate W is provided at a tip of the arm 623.

The lifting and rotation driver 621 causes the rotating shaft 622 to perform a lifting operation and a rotating operation. Thus, the holding pin 624 moves in the horizontal direction and the vertical direction.

Furthermore, a cleaning brush 630 for cleaning the outer edge and a back surface of the substrate W held by the spin chuck 610 is provided in a lower part of the cleaning/drying processing unit SD1. The cleaning brush 630 has a substantially columnar shape, and has a groove 635 with a V-shaped cross section formed on its outer peripheral surface. The cleaning brush 630 is held by a brush holding member 631. The brush holding member 631 is driven by a brush moving mechanism 632, so that the cleaning brush 630 moves in the horizontal direction and the vertical direction.

A cleaning nozzle 633 is attached to a portion, in close proximity to the cleaning brush 630, of the brush holding member 631. A liquid supply pipe (not shown) to which the cleaning liquid is supplied is connected to the cleaning nozzle 633. A discharge port of the cleaning nozzle 633 is directed toward the periphery of the cleaning brush 630, and the cleaning liquid is discharged toward the periphery of the cleaning brush 630 from the discharge port.

Figure 7:
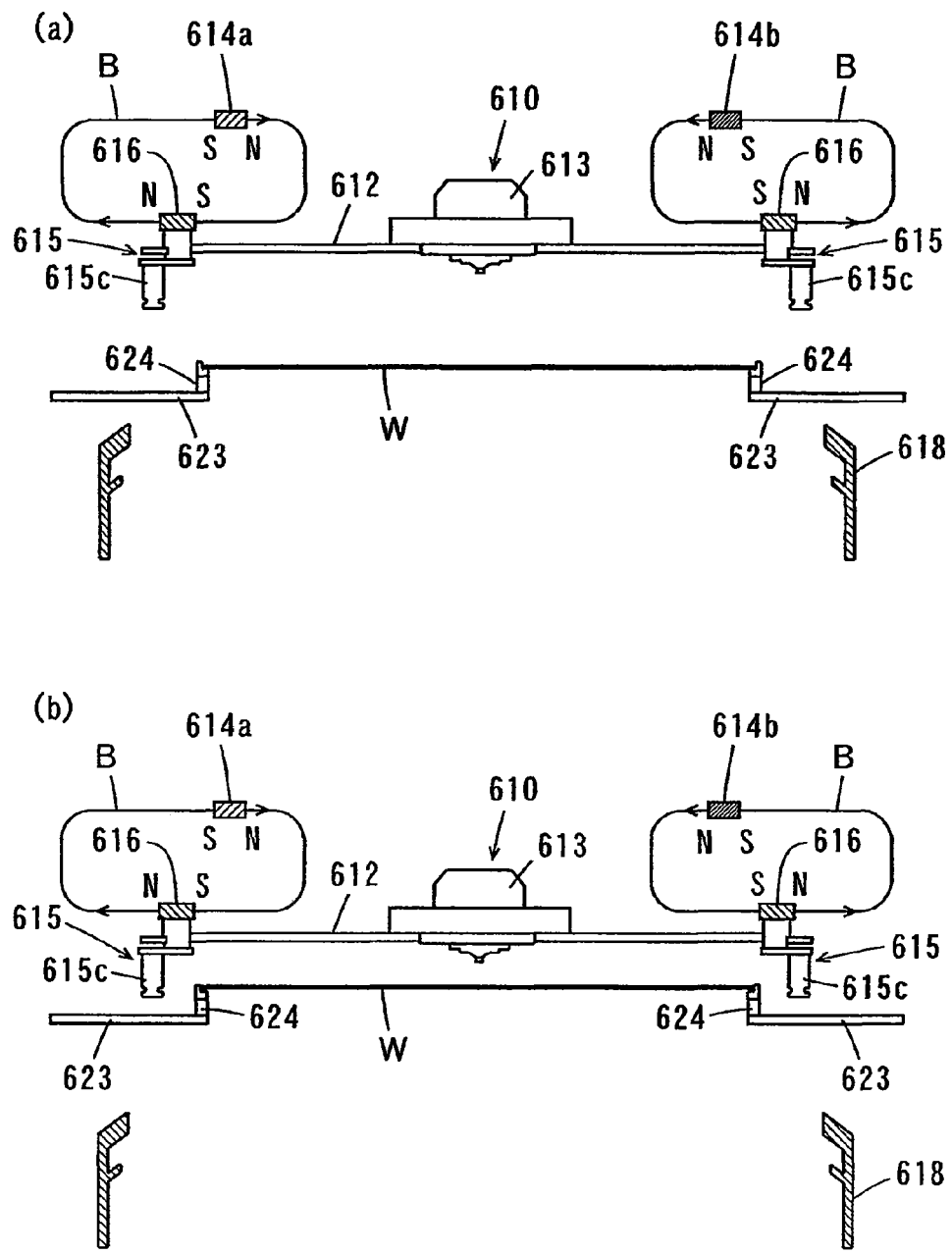
FIG. 7 is a diagram for explaining an operation for holding a substrate W by a spin chuck.

An operation for holding the substrate W by the spin chuck 610 will now be described. FIGS. 7 and 8 are diagrams for explaining the operation for holding the substrate W by the spin chuck 610.

First, the guard 618 moves to a position lower than the chuck pin 615, as shown in FIG. 7(a). The holding pin 624 in each of the plurality of substrate interface mechanism 620 (FIG. 5) moves to a position below the spin plate 612 through a position above the guard 618. The substrate W is placed on the plurality of holding pins 624 by the sixth central robot CR6 (FIG. 1).

At this time, the magnet plates 614a and 614b are at an upper position. In this case, a line of magnetic force B of each of the magnet plates 614a and 614b is directed outward from inside at the height of the magnet 616 in the chuck pin 615. Therefore, the S pole of the magnet 616 in each of the chuck pins 615 is sucked inward. This causes each of the chuck pins 615 to enter the opened state.

Then, the plurality of holding pins 624 rise with the substrate W held therein, as shown in FIG. 7(b). This causes the substrate W to move to positions among the holders 615c of the plurality of the chuck pins 615.

Then, the magnet plates 614a and 614b move to a lower position, as shown in FIG. 8(c). In this case, the N pole of the magnet 616 in each of the chuck pins 615 is sucked inward. This causes each of the chuck pins 615 to enter the closed state, causing the holder 615c in each of the chuck pins 615 to hold the outer edge of the substrate W. Note that each of the chuck pins 615 holds the outer edge of the substrate W between the adjacent holding pins 624. Therefore, the chuck pin 615 and the holding pin 624 do not interfere with each other. Thereafter, the plurality of holding pins 624 move outwardly from the guard 618.

Then, the guard 618 moves to a height at which the substrate W held by the chuck pin 615 is surrounded, as shown in FIG. 8(*d*). The substrate W is subjected to cleaning processing and drying processing in this order.

In the cleaning/drying unit SD1, top surface cleaning processing for cleaning a top surface (an upper surface) of the substrate W, back surface cleaning processing for cleaning a back surface (a lower surface) of the substrate W, and bevel cleaning processing for cleaning the outer edge (a bevel portion) of the substrate W are performed as the cleaning processing. Thereafter, the substrate W is subjected to the drying processing.

Figure 9:
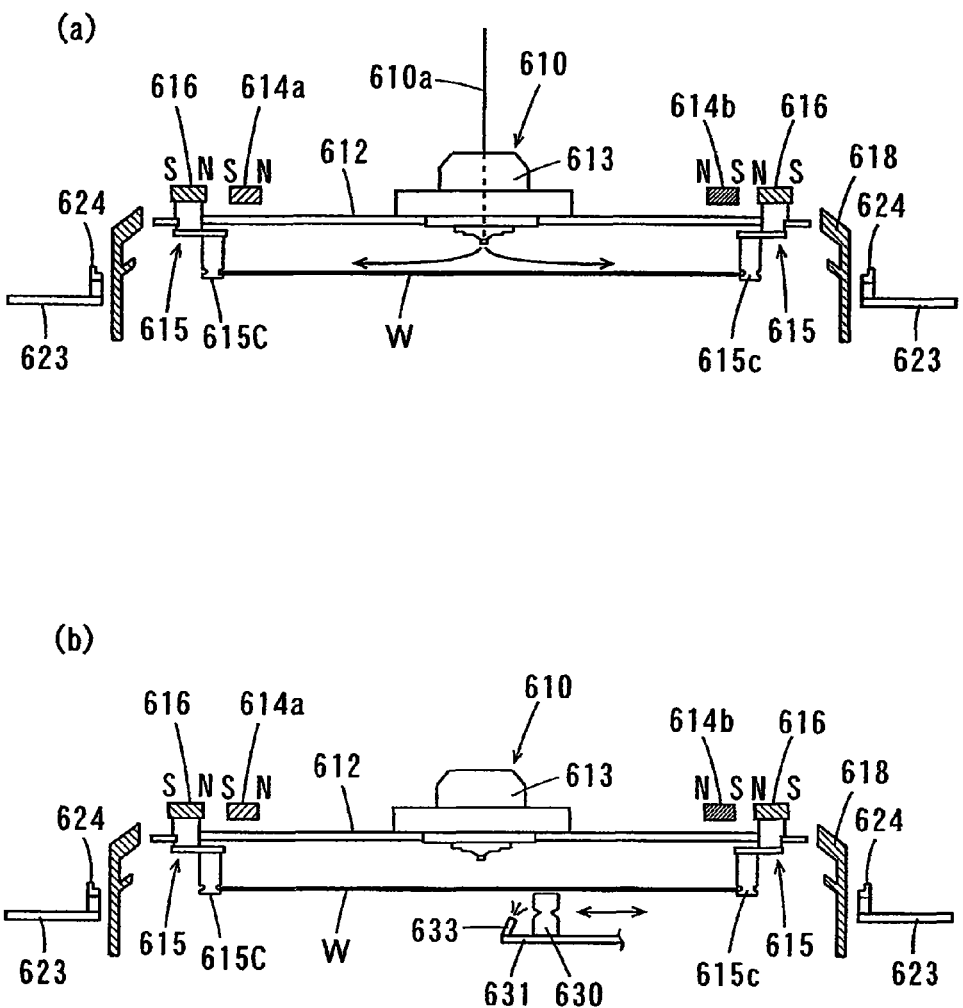
FIG. 9 is a side view for explaining top surface cleaning processing and back surface cleaning processing for a substrate.
Figure 10:
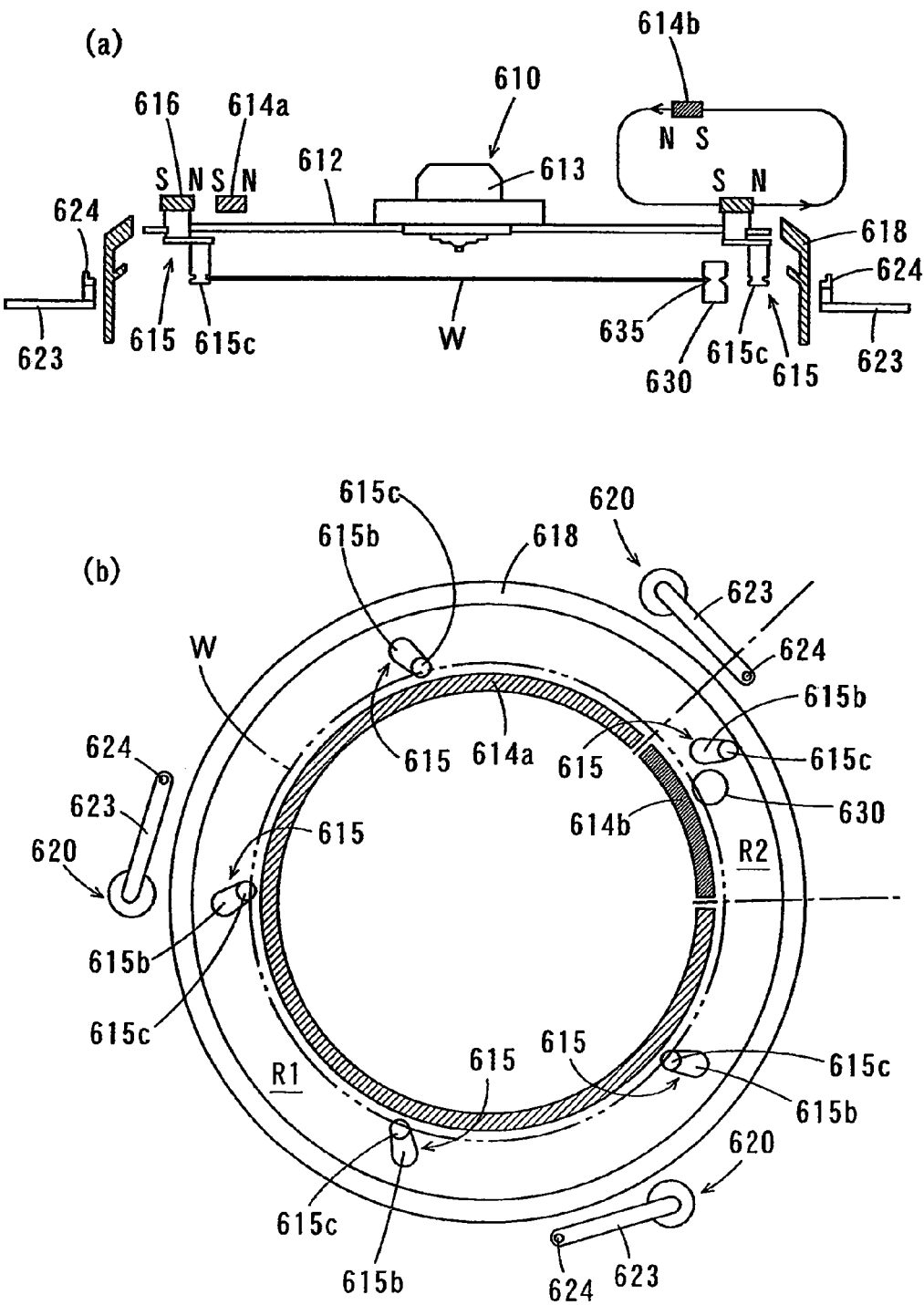
FIG. 10 is a side view and a plan view for explaining bevel cleaning processing for a substrate.

FIG. 9 is a side view for explaining the top surface cleaning processing and the back surface cleaning processing for the substrate W, and FIG. 10 is a side view and a plan view for explaining the bevel cleaning processing for the substrate W.

When the substrate W is subjected to the top surface cleaning processing, the cleaning liquid is supplied to the top surface of the substrate W through the liquid supply pipe 610a with the substrate W rotated by the spin chuck 610, as shown in FIG. 9(*a*). The cleaning liquid spreads over the whole top surface of the substrate W by a centrifugal force, and is scattered outward. This causes particles and the like that adhere to the top surface of the substrate W to be washed away. Furthermore, a part of a component of the resist cover film on the substrate W is eluted in the cleaning liquid and washed away.

When the substrate W is subjected to the back surface cleaning processing, the cleaning brush 630 moves to below the substrate W with the substrate W rotated by the spin chuck 610, as shown in FIG. 9(*b*). The cleaning brush 630 moves between a position below the center of the substrate W and a position below the peripheral portion thereof with the upper surface of the cleaning brush 630 and the back surface of the substrate W brought into contact with each other. The cleaning liquid is supplied from the cleaning nozzle 633 to a contact portion between the substrate W and the cleaning brush 630. This causes the whole back surface of the substrate W to be cleaned with the cleaning brush 630 while causing a contaminant that adheres to the back surface of the substrate W to be removed.

When the substrate W is subjected to the bevel cleaning processing, the magnet plate 614a is arranged at the lower position, and the magnet plate 614b is arranged at the upper position, as shown in FIGS. 10(*a*) and 10(*b*). In the state, the spin chuck 610 rotates the substrate W.

In this case, each of the chuck pins 615 enters a closed state in a region R1 outside the magnet plate 614a (see FIG. 10(*b*)), while entering an opened state in a region R2 outside the magnet plate 614b (see FIG. 10(*b*)). That is, the holder 615c in each of the chuck pins 615 is maintained in contact with the outer edge of the substrate W when it passes through the region R1 outside the magnet plate 614a, while being spaced apart from the outer edge of the substrate W when it passes through the region R2 outside the magnet plate 614b.

In this example, at least four of the five chuck pins 615 are positioned in the region R1 outside the magnet plate 614a. In this case, at least the four chuck pins 615 hold the substrate W. This causes the stability of the substrate W to be ensured.

In the state, the cleaning brush 630 moves to a position between the holder 615c in the chuck pin 615 and the outer edge of the substrate W in the region R2. The groove 635 of the cleaning brush 630 is abutted against the outer edge of the substrate W. The cleaning liquid is supplied from the cleaning nozzle 633 (FIG. 5) to the contact portion between the cleaning brush 630 and the substrate W. This causes the whole outer edge of the substrate W to be cleaned, causing a contaminant that adheres to the outer edge of the substrate W to be removed.

Note that the cleaning liquid may be supplied to the top surface of the substrate W through the liquid supply pipe 610a shown in FIG. 5 during the bevel cleaning processing. In the case, the bevel cleaning processing and the top surface cleaning processing can be simultaneously performed. Furthermore, a back surface cleaning brush for cleaning the back surface of the substrate W may be provided separately from the cleaning brush 630, and the back surface cleaning brush may be brought into contact with the back surface of the substrate W during the bevel cleaning processing. In this case, the bevel cleaning processing and the back surface cleaning processing can be simultaneously performed. Alternatively, the bevel cleaning processing, the top surface cleaning processing, and the back surface cleaning processing can be simultaneously performed.

The substrate W is subjected to the drying processing after the top surface cleaning processing, the back surface cleaning processing, and the bevel cleaning processing. In this case, the magnet plates 614a and 614b are arranged at the lower position, and all the chuck pins 615 hold the substrate W. In the state, the spin chuck 610 rotates the substrate W at high speed. This causes the cleaning liquid that adheres to the substrate W to be scattered, causing the substrate W to be dried.

Note that a gas such as inert gas (e.g., nitrogen gas) or air may be supplied to the substrate W through the liquid supply pipe 610a when the substrate W is subjected to the drying processing. In the case, the cleaning liquid on the substrate W is scattered outward by an air current formed between the spin plate 612 and the substrate W. This allows the substrate W to be efficiently dried.

In the present embodiment, in the cleaning/drying processing unit SD1, the substrate W is subjected to the cleaning processing before the exposure processing. This can prevent contamination in the exposure device 16 and can prevent a defective dimension and a defective shape of an exposure pattern.

When the substrate W is subjected to the top surface cleaning processing, a part of the component of the resist cover film on the substrate W is eluted in the cleaning liquid and washed away. This prevents the component of the resist cover film from being eluted in the liquid when a liquid is supplied onto the substrate W in the exposure device 16.

In the cleaning/drying processing unit SD1, spacing the holder 615c in the chuck pin 615 positioned in the region R2 apart from the outer edge of the substrate W while rotating the substrate W with the outer edge of the substrate W held by the holders 615c in the chuck pin 615 positioned in the region R1 allows the outer edge of the substrate W to be cleaned with the cleaning brush 630. In this case, the outer edge of the substrate W can be sufficiently cleaned without forming suction marks and the like on the back surface of the substrate W, unlike in a case where a suction type spin chuck that holds the back surface of the substrate W by vacuum suction is used.

In the cleaning/drying processing unit SD1, the spin chuck 610 is positioned above the substrate W. This allows the back surface of the substrate W to be cleaned with the cleaning brush 630, allowing a contaminant that adheres to the back surface of the substrate W to be reliably removed. Even when suction marks are formed on the back surface of the substrate W by the suction type spin chuck in the other units such as the coating unit RES, the suction marks can be reliably removed before the exposure processing. This can reliably prevent contamination in the exposure device 16 and defocusing caused by irregularities on the back surface of the substrate W.

Furthermore, in the cleaning/drying processing unit SD2, the substrate W is subjected to the cleaning processing after the exposure processing. In this case, even if particles and the like in an atmosphere adhere to the substrate W to which the liquid has adhered during the exposure processing, the attachment can be removed. This can reliably prevent processing defects in the substrate W. Furthermore, the substrate W after the exposure processing is kept clean, which can prevent development defects from occurring.

Although in the cleaning/drying processing units SD1 and SD2 in the first embodiment, the chuck pin 615 is switched between the closed state and the opened state by the magnetic force, the chuck pin 615 may be switched between the closed state and the opened state by mechanical construction and electrical control.

Although in the cleaning/drying processing units SD1 and SD2 in the first embodiment, the spin chuck 610 that holds the substrate W below the spin plate 612 is used, a spin chuck that holds the substrate W above the spin plate 612 may be used.

The respective numbers of cleaning/drying processing units SD1 and SD2, coating units BARC, RES, and COV, developing processing units DEV, removal units REM, heating units HP, cooling units CP, and placement/cooling units P-CP may be appropriately changed depending on the processing speed of each of the processing blocks.

Although in the first embodiment, the cleaning/drying processing units SD1 and SD2 are arranged in the interface block 15, at least one of the cleaning/drying processing units SD1 and SD2 may be arranged in the resist cover film removal block 14 shown in FIG. 1. Alternatively, a cleaning/drying processing block including at least one of the cleaning/drying processing units SD1 and SD2 may be provided between the resist cover film removal block 14 and the interface block 15 shown in FIG. 1.

Although in the present embodiment, description was made of a case where the exposure device 16 that subjects the substrate W to the exposure processing by means of the liquid immersion method is provided as a device external to the substrate processing apparatus 500, the present invention is not limited to the same. For example, an exposure device that subjects the substrate W to exposure processing without using a liquid may be provided as a device external to the substrate processing apparatus 500.

Figure 11:
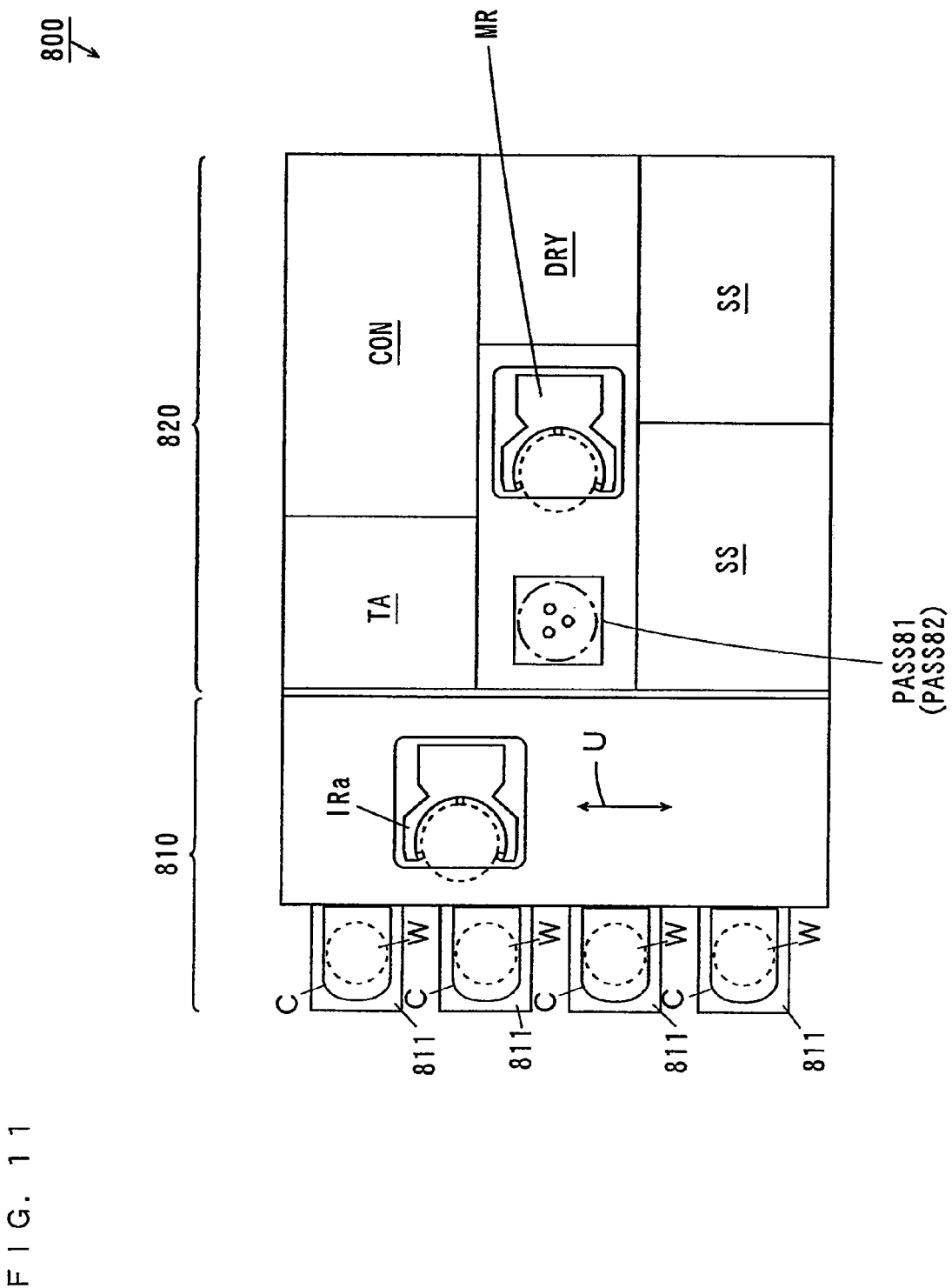
FIG. 11 is a plan view of a substrate processing apparatus according to a second embodiment of the present invention.

FIG. 11 is a plan view of a substrate processing apparatus according to a second embodiment of the present invention. In the substrate processing apparatus, a substrate W is subjected to cleaning processing with various types of films not formed on the substrate W.

As shown in FIG. 11, a substrate processing apparatus 800 includes an indexer 810 and a cleaning processor 820. The indexer 810 is provided with a plurality of carrier platforms 811 and an indexer robot IRa. Carriers C that store a plurality of substrates W in a multiple stage are respectively carried onto the carrier platforms 811. The indexer robot IRa transports the substrate W between the carriers C and the cleaning processor 820.

A main robot MR is provided at the center of the cleaning processor 820. Substrate platforms PASS81 and PASS82 on which the substrate W is temporarily placed are provided one above the other between the main robot MR and the indexer 810. Furthermore, two cleaning processing units SS, a drying processing unit DRY, a control unit CON, and a processing liquid storage TA are provided so as to surround the main robot MR.

Note that the respective numbers of cleaning processing units SS and drying processing units DRY are not limited to the foregoing. For example, they may be optionally set. Furthermore, the plurality of cleaning processing units SS and the plurality of drying processing units DRY may be respectively layered in multiple stages.

The cleaning processing unit SS subjects the substrate W to cleaning processing. The details of the cleaning processing unit SS will be described later. The drying processing unit DRY subjects the substrate W to drying processing after the cleaning processing. The control unit CON controls the operation of each of constituent elements in the substrate processing apparatus 800. The processing liquid storage TA contains fluid related equipment such as a storage tank that stores a processing liquid such as a cleaning liquid and piping.

The operation of the substrate processing apparatus 800 will be then described. First, the indexer robot IRa takes out the unprocessed substrate W that is stored in the carrier C. Then, the indexer robot IRa rotates around a vertical axis while moving in a direction indicated by an arrow U, to place the unprocessed substrate W on the substrate platform PASS82.

The unprocessed substrate W placed on the substrate platform PASS82 is received by the main robot MR. The main robot MR carries the substrate W into the cleaning processing unit SS. Thereafter, the main robot MR takes out the substrate W after the cleaning processing from the cleaning processing unit SS and carries the substrate W into the drying processing unit DRY.

Then, the main robot MR takes out the substrate W after the drying processing from the drying processing unit DRY and places the substrate W on the substrate platform PASS81. The substrate W placed on the substrate platform PASS81 is stored in the carrier C by the indexer robot IRa. Processing for the substrate W in the substrate processing apparatus 800 is thus terminated.

As to the cleaning processing unit SS, the difference from the above-mentioned cleaning/drying processing unit SD1 will be then described. FIGS. 12 and 13 are a side view and a schematic plan view showing the configuration of the cleaning processing unit SS. FIG. 13 schematically shows some of constituent elements in the cleaning processing unit SS.

As shown in FIG. 12, in the cleaning processing unit SS, a top surface cleaning mechanism 660 is provided below a spin chuck 610. The top surface cleaning mechanism 660 includes a lifting and rotation driver 661, a rotating shaft 662, an arm 663, and a top surface cleaning brush 664. The rotating shaft 662 is provided so as to extend upward from the lifting and rotation driver 661, and the arm 663 is connected thereto so as to extend in the horizontal direction from an upper end of the rotating shaft 662. A top surface cleaning brush 664 is attached to a tip of the arm 663. The lifting and rotation driver 661 causes the rotating shaft 662 to perform a lifting operation and a rotating operation. This causes the top surface cleaning brush 664 to move in the horizontal direction and the vertical direction.

As shown in FIG. 13, the rotating shaft 662 in the top surface cleaning mechanism 660 is positioned in a region R2 outside a magnet plate 614b. The arm 663 in the top surface cleaning mechanism 660 is curved along the outer periphery of the substrate W. The length of the arm 663 is set substantially equal to the length of the magnet plate 614b. Furthermore, eight chuck pins 615 are equiangularly spaced with respect to a rotating shaft 611a in a peripheral portion of a spin plate 612 shown in FIG. 12.

In the cleaning processing unit SS, the substrate W is subjected to back surface cleaning processing as shown in FIG. 9(b), bevel cleaning processing as shown in FIG. 10, and top surface cleaning processing using the top surface cleaning brush 664. FIG. 14 is a side view and a schematic plan view for explaining the top surface cleaning processing for the substrate W using the top surface cleaning brush 664.

During the top surface cleaning processing, the magnet plate 614a and the magnet plate 614b are respectively arranged at a lower position and an upper position, as shown in FIGS. 14(a) and 14(b). In this state, the spin chuck 610 rotates the substrate W. In this case, the holder 615c in each of the chuck pins 615 is maintained in contact with an outer edge of the substrate W when it passes through a region R1 outside the magnet plate 614a, while being spaced apart from the outer edge of the substrate W when it passes through the region R2 outside the magnet plate 614b, as during the above-mentioned bevel cleaning processing.

In this example, at least six of the eight chuck pins 615 are positioned in the region R1 outside the magnet plate 614a. In this case, at least the six chuck pins 615 hold the substrate W. This causes the stability of the substrate W to be ensured.

The rotating shaft 662 in the top surface cleaning mechanism 660 rises to a predetermined height after passing between the outer edge of the substrate W and the holder 615c in the chuck pin 615, which are spaced apart from each other. The arm 663 rotates around the rotating shaft 662. This causes the top surface cleaning brush 664 to move to a position between the spin plate 612 and the top surface of the substrate W.

When the rotating shaft 662 rises, the arm 663 is maintained along the outer periphery of the substrate W (a state indicated by a dotted line in FIG. 14(b)). In this state, the arm 663 passes between the outer edge of the substrate W and the holder 615c in the chuck pin 615, which are spaced apart from each other, in the region R2.

Then, the top surface cleaning brush 664 moves between a position above the center of the substrate W and a position above the peripheral portion of the substrate W with the lower surface of the top surface cleaning brush 664 and the top surface of the substrate W brought into contact with each other. Furthermore, the cleaning liquid is supplied to the top surface of the substrate W through a liquid supply pipe 610a shown in FIG. 12. This causes the whole top surface of the substrate W to be cleaned with the top surface cleaning brush 664, causing a contaminant that adheres to the top surface of the substrate W to be sufficiently removed.

Note that the top surface cleaning processing using the top surface cleaning brush 664 and the bevel cleaning processing for the substrate W using the cleaning brush 630 may be simultaneously performed. Furthermore, a back surface cleaning brush for cleaning the back surface of the substrate W may be provided separately from the cleaning brush 630 and the top surface cleaning brush 664, to simultaneously perform the top surface cleaning processing and the back surface cleaning processing using the back surface cleaning brush. Alternatively, the bevel cleaning processing, the top surface cleaning processing, and the back surface cleaning processing may be simultaneously performed.

The substrate W is subjected to the drying processing, as in the above-mentioned cleaning/drying processing unit SD1, after the top surface cleaning processing, the back surface cleaning processing, and the bevel cleaning processing.

In the present embodiment, the top surface, the back surface, and the outer edge of the substrate W can be cleaned in the common cleaning processing unit SS. Therefore, it is possible to reduce the footprint of the substrate processing apparatus 800 and miniaturize the substrate processing apparatus 800, as compared with those in a case where a unit for cleaning the top surface of the substrate W, a unit for cleaning the back surface of the substrate W, and a unit for cleaning the outer edge of the substrate W are separately provided. Furthermore, the process for transporting the substrate W can be reduced, as compared with that in the case where the plurality of units are provided. This allows throughput to be improved.

Although in the cleaning processing unit SS according to the second embodiment, the chuck pin 615 is switched between a closed state and an opened state by a magnetic force, the chuck pin 615 may be switched between a closed state and an opened state by mechanical construction and electrical control.

Although in the cleaning processing unit SS in the second embodiment, the spin chuck 610 that holds the substrate W below the spin plate 612 is used, a spin chuck that holds the substrate W above the spin plate 612 may be used.

Although in the above-mentioned embodiment, description was made of a case where the cleaning/drying processing unit SD1 is provided in the substrate processing apparatus 500 and a case where the cleaning processing unit SS is provided in the substrate processing apparatus 800, the present invention is not limited to the same. The cleaning/drying processing unit SD1 and the cleaning processing unit SS may be provided in other substrate processing apparatuses. Alternatively, the cleaning/drying processing unit SD1 and the cleaning processing unit SS may be used alone.

In the following two paragraphs, non-limiting examples of correspondences between various elements recited in the claims below and those described above with respect to various embodiments of the present invention are explained.

In the embodiments described above, the spin chuck 610 is an example of a substrate holding and rotating device, the spin plate 612 is an example of a rotating member, the spin motor 611 is an example of a rotation-driving mechanism, the chuck pin 615 is an example of a holding member, the magnet plates 614a and 614b and the magnet lifting mechanisms 617a and 617b are examples of a holding member switching mechanism, the magnet plate 614a is an example of a first magnetic force generating member and a first magnet member, and the magnet plate 614b is an example of a second magnetic force generating member and a second magnet member.

The cleaning/drying processing units SD1 and SD2 and the cleaning processing unit SS are examples of a substrate cleaning apparatus, the cleaning brush 630 is an example of a first cleaner, the brush moving mechanism 632 is an example of a first cleaner moving mechanism, the top surface cleaning brush 664 is an example of a second cleaner, the lifting and rotation driver 661 is an example of a second cleaner moving mechanism, the holding pin 624 is an example of a substrate supporting member, and the lifting and rotation driver 621 is an example of a supporting member lifting mechanism.

Furthermore, the anti-reflection film processing block 10, the resist film processing block 11, the development processing block 12, the resist cover film processing block 13, the resist cover film removal block 14 are examples of a processing section, and the interface block 15 is an example of an interface.

As each of various elements recited in the claims, various other elements having configurations or functions described in the claims can be also used.

While several embodiments of the present invention have been described above, it is to be understood that variations and modifications will be apparent to those skilled in the art without departing the scope and spirit of the present inven-

What is claimed is:

1. A substrate cleaning apparatus comprising:
a substrate holding and rotating device that rotates a substrate while holding the substrate;
a first cleaner for cleaning an outer edge of the substrate; and
a first cleaner moving mechanism that moves the first cleaner,
wherein the substrate holding and rotating device includes
a rotating member provided so as to be rotatable around a rotation axis,
a rotation-driving mechanism that rotates the rotating member,
a plurality of holding members provided on the rotating member so as to be switchable between a substrate held state where they are abutted against the outer edge of the substrate to hold the substrate and a substrate released state where they are spaced apart from the outer edge of the substrate, and
a holding member switching mechanism that switches the plurality of holding members between the substrate held state and the substrate released state,
each of the plurality of holding members rotates around the rotation axis through a first region and a second region along the outer edge of the substrate as the rotation-driving mechanism rotates the rotating member,
the holding member switching mechanism brings the holding members positioned in the first region into the substrate held state while bringing any holding member positioned in the second region into the substrate released state during the rotation of the rotating member, and
the first cleaner moving mechanism moves the first cleaner to the second region when the holding members positioned in the first region is in the substrate held state while the holding members positioned in the second region is in the substrate released state.

2. The substrate cleaning apparatus according to claim 1 further comprising:
a second cleaner for cleaning an upper surface or a lower surface of the substrate, and
a second cleaner moving mechanism that moves the second cleaner wherein the second cleaner moving mechanism moves the second cleaner to the upper surface or the lower surface of the substrate through the second region when the holding members positioned in the first region are in the substrate held state while any holding member positioned in the second region is in the substrate released state.

3. The substrate cleaning apparatus according to claim 1 wherein the holding member switching mechanism includes:
a first magnetic force generating member that switches the holding members positioned in the first region to the substrate held state by a magnetic force, and
a second magnetic force generating member that switches the holding member positioned in the second region to the substrate released state by a magnetic force.

4. The substrate cleaning apparatus according to claim 3 wherein:
the first magnetic force generating member includes a first magnet member that is brought closer to or spaced apart from the holding members positioned in the first region to exert the magnetic force on the holding members positioned in the first region, and
the second magnetic force generating member includes a second magnet member that is brought closer to or spaced apart from the holding member positioned in the second region to exert the magnetic force on any holding member positioned in the second region.

5. The substrate cleaning apparatus according to claim 1 wherein each of the plurality of holding members includes a holder provided so as to be movable between an abutment position where it is abutted against the outer edge of the substrate and a spacing position where it is spaced apart from the outer edge of the substrate below the rotating member, the substrate cleaning apparatus further comprising:
a substrate supporting member that supports the substrate below the rotating member, and
a supporting member lifting mechanism that lifts the substrate supporting member.

6. A substrate processing apparatus that is arranged adjacent to an exposure device, the substrate processing apparatus comprising:
a processing section for subjecting a substrate to processing; and
an interface for transferring and receiving the substrate between the processing section and the exposure device wherein at least one of the processing section and the interface includes:
a cleaning processing unit that subjects the substrate to cleaning processing, wherein the cleaning processing unit includes:
a substrate holding and rotating device that rotates the substrate while holding the substrate,
a cleaner for cleaning an outer edge of the substrate, and
a cleaner moving mechanism that moves the cleaner,
wherein the substrate holding and rotating device includes:
a rotating member provided so as to be rotatable around a rotation axis;
a rotation-driving mechanism that rotates the rotating member,
a plurality of holding members provided on the rotating member so as to be switchable between a substrate held state where they are abutted against the outer edge of the substrate to hold the substrate and a substrate released state where they are spaced apart from the outer edge of the substrate, and
a holding member switching mechanism that switches the plurality of holding members between the substrate held state and the substrate released state,
wherein each of the plurality of holding members rotates around the rotation axis through a first region and a second region along the outer edge of the substrate as the rotation-driving mechanism rotates the rotating member,
the holding member switching mechanism brings the holding members positioned in the first region into the substrate held state while bringing any holding member positioned in the second region into the substrate released state during the rotation of the rotating member, and
the cleaner moving mechanism moves the cleaner to the second region with the holding member switching mechanism switching the holding members in the first region to the substrate held state while switching any holding member in the second region to the substrate released state.

* * * * *